United States Patent
Rueger et al.

(10) Patent No.: US 6,619,268 B2
(45) Date of Patent: Sep. 16, 2003

(54) METHOD AND APPARATUS FOR REGULATING VOLTAGES AND VOLTAGE GRADIENTS FOR DRIVING PIEZOELECTRIC ELEMENTS

(75) Inventors: Johannes-Jörg Rueger, Vaihingen/enz (DE); Matthias Mrosik, Stuttgart (DE); Volker Pitzal, Waldstetten/Wissgoldingen (DE); Udo Schulz, Vaihingen/enz (DE)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 09/825,543

(22) Filed: Apr. 2, 2001

(65) Prior Publication Data

US 2002/0023622 A1 Feb. 28, 2002

(30) Foreign Application Priority Data

Apr. 1, 2000 (EP) .............................. 00107202

(51) Int. Cl.$^7$ ............................... F02M 51/00
(52) U.S. Cl. ................ 123/490; 310/316.03; 123/498
(58) Field of Search ................ 123/472, 478, 123/490, 498; 310/316.03, 317; 239/585.1, 585.5

(56) References Cited

U.S. PATENT DOCUMENTS

| | | | | |
|---|---|---|---|---|
| 5,130,598 A | * | 7/1992 | Verheyen et al. | 310/316.03 |
| 5,208,505 A | * | 5/1993 | Mitsuyasu | 310/316.03 |
| 6,016,040 A | * | 1/2000 | Hoffmann et al. | 310/317 |
| 6,060,814 A | * | 5/2000 | Hoffmann et al. | 310/316.03 |
| 6,079,641 A | * | 6/2000 | Shinogle et al. | 239/533.4 |
| 6,137,208 A | * | 10/2000 | Hoffmann et al. | 310/316.03 |
| 6,147,433 A | * | 11/2000 | Reineke et al. | 310/316.03 |
| 6,198,199 B1 | * | 3/2001 | Hoffmann et al. | 310/316.03 |
| 6,236,190 B1 | * | 5/2001 | Hoffmann et al. | 320/166 |
| 6,253,736 B1 | * | 7/2001 | Crofts et al. | 123/467 |
| 6,384,512 B1 | * | 5/2002 | Maeda | 310/316.03 |
| 6,499,464 B2 | * | 12/2002 | Rueger | 123/446 |
| 2001/0050512 A1 | * | 12/2001 | Rueger et al. | 310/315 |
| 2002/0017280 A1 | * | 2/2002 | Rueger et al. | 123/498 |

FOREIGN PATENT DOCUMENTS

| | | | |
|---|---|---|---|
| DE | 197 29 844 | | 1/1999 |
| DE | 197 42 073 | | 3/1999 |
| EP | 0 371 469 | | 6/1990 |
| EP | 0 379 182 | | 7/1990 |
| EP | 0 464 443 | | 1/1992 |
| EP | 1139448 | * 10/2001 | ........... F02D/41/20 |
| WO | WO 98/27601 | | 6/1998 |

* cited by examiner

Primary Examiner—Willis R. Wolfe
Assistant Examiner—Hai Huynh
(74) Attorney, Agent, or Firm—Kenyon & Kenyon

(57) ABSTRACT

The invention describes a method and an apparatus for a fuel injection system with a piezoelectric element for controlling the amount of injected fuel by charging and/or discharging the piezoelectric element, wherein the fuel injection system comprises a current flow controller for charging and/or discharging the piezoelectric element based upon the gradient of a voltage across the piezoelectric element due to a charge the piezoelectric element is carrying.

26 Claims, 13 Drawing Sheets

METHOD AND APPARATUS FOR REGULATING VOLTAGES AND VOLTAGE GRADIENTS FOR DRIVING PIEZOELECTRIC ELEMENTS

The present invention concerns a fuel injection system as defined in the preambles of claims 1 and 10 and a method for operating a fuel injection system as defined in the preambles of claims 13 and 14.

Fuel injection systems may use piezoelectric actuators or elements, in which the piezoelectric actuators or elements exhibit a proportional relationship between an applied voltage and a linear expansion. Thus, it is believed that using piezoelectric elements as actuators may be advantageous, for example, in fuel injection nozzles for internal combustion engines. The European Patent Specifications EP 0 371 469 B1 and EP 0 379 182 B1 concern the use of piezoelectric elements in fuel injection nozzles.

When piezoelectric elements are used as actuators in fuel injection nozzles (which may be "common rail" injectors) of an internal combustion engine, fuel injection may be controlled by applying voltages to the piezoelectric actuators or elements, which expand or contract as a function of the applied voltage. As a result, an injector needle that may be connected to the piezoelectric actuators or elements by a transfer arrangement or system is moved up and down so as to open and close an injection nozzle. The application of the voltage may be controlled by a feedback system, which may involve comparing an obtained voltage to a target voltage and ending a corresponding charging procedure when the obtained voltage equals the target voltage.

Control systems for controlling the piezoelectric actuator may include a control arrangement or unit (which may include a central processing unit (CPU)), at least one controlled piezoelectric element and a utilization arrangement, which transforms the control signals as necessary and applies them to the controlled piezoelectric element. For this purpose, the control arrangement and the utilization arrangement may be connected to each other by a communication arrangement, such as a bus system. Moreover, external data may need to be communicated to the control arrangement and/or the utilization arrangement in a corresponding way.

In the example of a fuel injection nozzle, the expansion and contraction of piezoelectric elements may be used to control valves that manipulate the linear strokes of injection needles. The use of piezoelectric elements, for example, with double-acting, double-seat valves to control corresponding injection needles in a fuel injection system is shown in German Patent Applications DE 197 42 073 A1 and DE 197 29 844 A1, which are incorporated herein in their entirety.

In a fuel injection system, one goal may be to achieve a desired fuel injection volume with sufficient accuracy, especially for small injection volumes, such as, for example, during pilot injection. Using, for example, a double-acting, double-seat control valve, the piezoelectric element may be expanded or contracted by applying an activation voltage so that a corresponding controlled valve plug is positioned midway between the two seats of the double-seat valve to position the corresponding injection needle for maximum fuel flow during a set time period. It is, however, difficult to determine and apply a sufficiently precise activation voltage so that, for example, a corresponding valve plug is accurately or precisely positioned for maximum fuel flow.

Thus, for example, because the "travel" of a piezoelectric element depends on its temperature, the maximum travel may be reduced considerably at very low temperatures (such as, for example, temperatures less than 0° C.). Conversely, at high temperatures, the maximum travel may increase. Therefore, in designing a fuel injection system, the temperature dependence should be considered so that any associated deviation may be minimized or at least reduced. If, however, the piezoelectric element temperature is not directly measured, the temperature must be derived indirectly. Since the piezoelectric element capacitance also exhibits temperature response, the capacitance may be used to estimate the piezoelectric element temperature and therefore the desired maximum travel of the piezoelectric actuator or element.

As discussed, piezoelectric actuators or elements may be driven using voltage control. One object of driving piezoelectric actuators or elements is to charge or discharge the actuator within a specified time. In this regard, voltage gradients arise when charging and discharging the piezoelectric actuators or elements, and depend on or are a function of the average charging or discharging currents. Depending on the application, the current gradient may be, for example, on the order of about $10A/\mu sec$. Since the switches that may be used for the current regulation and driver logic may, for example, have switching times of about 1 $\mu sec$, for example, the desired current may be exceeded, for example, by up to about 10 Amps. Therefore, the actual voltage gradient may systematically differ from the desired voltage gradient during the charging and discharging operations so that there is a deviation in the start and the duration of the drive for the fuel injectors.

It is therefore believed that there is a need to correct, eliminate or at least reduce these systematic errors to increase the drive accuracy of the fuel injection components.

It is also believed that there is a need to provide a relatively cost effective or inexpensive and simple method and system to compensate for the systematic errors to increase the accuracy of the fuel injection system, especially during the startup and/or pilot injections.

It is also believed that there is a need to provide a method and system to correct any errors caused by the current cycling hardware during the discharging and charging of the piezoelectric actuators or elements to increase the drive accuracy of the fuel injection components.

It is also believed that there is a need to provide a method and system to "freeze" or hold the last output of a drive controller, whether a voltage controller or a voltage gradient controller, during certain conditions so that the drive controller does not "run up" against a system "stop" and provide incorrect values when the drive controller is enabled again.

Additionally, as discussed above, temperature may affect piezoelectric elements. Piezoelectric elements are, however, capacitive elements that, as discussed above, contract and expand according to a particular charge state or an applied voltage. The capacitance depends, however, on frequency. In this regard, the frequency corresponds to a charge rate (that is, a charge amount per a unit of time) that is delivered to the piezoelectric element. Therefore, in the context of the present application, a time between the beginning and the end of a charging procedure corresponds to the frequency. The capacitance of the piezoelectric should be adjusted to compensate, eliminate or at least reduce its frequency dependence to determine relatively accurate or precise piezoelectric travel based on its capacitance. Otherwise, the determined piezoelectric actuator temperature, and associated maximum travel may be incorrect, which may result in a less precise amount of fuel being injected.

It is therefore believed that there is a need to provide a method and system that compensates for deviations that are caused by any frequency dependence of the capacitance of the piezoelectric elements so that the maximum actuator travel may be estimated with sufficient accuracy so that the drive voltage may be accurately or precisely adjusted.

To facilitate the above, it is believed that there is a need for an apparatus and method for measuring the charge quantity of piezoelectric elements in a timely and accurate way using a measurement and calibration features, which may facilitate diagnosing the piezoelectric actuator or element, and compensating for the temperature and aging characteristics and regulating the reference voltage.

It is also believed that there is a need for an apparatus and method for a timed measurement of the charge quantity across a piezoelectric element, in which the charge quantity across the piezoelectric element is determined or sensed and is provided at a predefined time in synchronization with an injection operation of the piezoelectric element.

An object of an exemplary embodiment of the present invention is directed to providing a fuel injection system with a piezoelectric element for controlling the amount of injected fuel by charging and/or discharging the piezoelectric element, characterized in that the fuel injection system comprises a current flow controller for charging and/or discharging the piezoelectric element based upon the gradient of a voltage across the piezoelectric element due to a charge the piezoelectric element is carrying.

Another object of an exemplary embodiment of the present invention is directed to providing the above fuel injection system, characterized in that the current flow controller has a desired charging current for charging and/or discharging the piezoelectric element as an output.

Still another object of an exemplary embodiment of the present invention is directed to providing the above fuel injection system, characterized in that the current flow controller comprises an integrator.

Yet another object of an exemplary embodiment of the present invention is directed to providing the above fuel injection system, characterized in that the current flow controller comprises a proportional-integrating ("PI") controller.

Still another object of an exemplary embodiment of the present invention is directed to providing the above fuel injection system, characterized in that the current flow controller comprises at least one charge subcontroller for charging the piezoelectric element based upon the gradient of the voltage across the piezoelectric element and at least one discharge subcontroller for discharging the piezoelectric element based upon the gradient of the voltage across the piezoelectric element.

Yet another object of an exemplary embodiment of the present invention is directed to providing the above fuel injection system, further comprising a double acting valve being driven by the piezoelectric element, the double acting valve having a first closed position, a second closed position, and an open position, characterized in that the current flow controller comprises a first charge subcontroller for charging the piezoelectric element based upon the gradient of the voltage across the piezoelectric element for moving the double acting valve from the first closed position to the open position and a second charge subcontroller for charging the piezoelectric element based upon the gradient of the voltage across the piezoelectric element for moving the double acting valve from the open position to the second closed position.

Still another object of an exemplary embodiment of the present invention is directed to providing the above fuel injection system, characterized in that the current flow controller further comprises a first discharge subcontroller for discharging the piezoelectric element based upon the gradient of the voltage across the piezoelectric element for moving the double acting valve from the second closed position to the open position and a second discharge subcontroller for discharging the piezoelectric element based upon the gradient of the voltage across the piezoelectric element for moving the double acting valve from the open position to the first closed position.

Yet another object of an exemplary embodiment of the present invention is directed to providing the above fuel injection system, characterized in that the current flow controller comprises a hold element capable of keeping the output of the current flow controller at a constant value.

Still another object of an exemplary embodiment of the present invention is directed to providing the above fuel injection system, characterized in that the charge subcontroller and/or the discharge subcontroller comprises a hold element capable of keeping its output at a constant value.

Yet another object of an exemplary embodiment of the present invention is directed to providing the above fuel injection system, with a piezoelectric element for controlling the amount of injected fuel by charging and/or discharging the piezoelectric element to a voltage, characterized in that the fuel injection system comprises a voltage controller for controlling the voltage based upon a desired and a measured value of the voltage.

Still another object of an exemplary embodiment of the present invention is directed to providing the above fuel injection system, characterized in that the voltage controller controls the voltage based upon a desired value of the voltage and a measured value of the voltage associated with a former injection.

Yet another object of an exemplary embodiment of the present invention is directed to providing the above fuel injection system, characterized in that the voltage controller controls the voltage based upon a desired value of the voltage and a measured value of the voltage associated with a previous injection of fuel.

Still another object of an exemplary embodiment of a method of the present invention is directed to providing a method for operating a fuel injection system with a piezoelectric element for controlling the amount of injected fuel, in particular for operating a fuel injection system according to one of the above fuel injection systems, wherein the amount of injected fuel is controlled by charging and/or discharging the piezoelectric element, characterized in that the piezoelectric element is charged and/or discharged based upon the gradient of a voltage across the piezoelectric element due to a charge it is carrying.

Yet another object of an exemplary embodiment of a method of the present invention is directed to providing a method for operating a fuel injection system with a piezoelectric element for controlling the amount of injected fuel, in particular for operating a fuel injection system according to one of the above fuel injection systems, wherein the amount of injected fuel is controlled by charging and/or discharging the piezoelectric element to a voltage, characterized in that the voltage is controlled based upon a desired and a measured value of the voltage.

An object of an exemplary embodiment of the present invention is directed to providing a fuel injection system with a piezoelectric element for controlling the amount of injected fuel by applying a voltage to the piezoelectric element, characterized in that the fuel injection system comprises a control unit for adjusting the applied voltage based upon a nonlinear relationship between the applied voltage and the charging time.

Another object of an exemplary embodiment of the present invention is directed to providing the above fuel injection system, characterized in that the nonlinear relationship between the applied voltage and the charging time is based upon a dependency of a capacitance of the piezoelectric element on the charging time.

Still another object of an exemplary embodiment of the present invention is directed to providing a fuel injection system with a piezoelectric element for controlling the amount of injected fuel by applying a voltage to the piezoelectric element, characterized in that the fuel injection system comprises a control unit for adjusting the applied voltage based upon a dependency of a capacitance of the piezoelectric element on the charging time.

Yet another object of an exemplary embodiment of the present invention is directed to providing the above fuel injection system, characterized in that the fuel injection system comprising a current measuring unit for measuring a current for charging the piezoelectric element.

Still another object of an exemplary embodiment of the present invention is directed to providing the above fuel injection system, characterized in that the control unit further adjusts the applied voltage based upon a current for charging the piezoelectric element.

Yet another object of an exemplary embodiment of a method of the present invention is directed to providing a method for operating a fuel injection system with a piezoelectric element for controlling an amount of injected fuel by applying a voltage to the piezoelectric element, characterized in that the applied voltage is adjusted based upon a nonlinear relationship between the applied voltage and the charging time.

Still another object of an exemplary embodiment of a method of the present invention is directed to providing the above method, characterized in that the nonlinear relationship between the applied voltage and the charging time is based upon a dependency of a capacitance of the piezoelectric element on the charging time.

Yet another object of an exemplary embodiment of a method of the present invention is directed to providing a method for operating a fuel injection system with a piezoelectric element for controlling an amount of infected fuel by applying a voltage to the piezoelectric element characterized in that the applied voltage is adjusted based upon a dependency of a capacitance of the piezoelectric element on the charging time.

Still another object of an exemplary embodiment of a method of the present invention is directed to providing the above method, characterized in that a current for charging the piezoelectric element is measured.

Yet another object of an exemplary embodiment of a method of the present invention is directed to providing the above method, characterized in that the applied voltage is further adjusted based upon a current for charging the piezoelectric element.

An object of an exemplary embodiment of a method of the present invention is directed to providing a method for operating a fuel injection system having a piezoelectric element for controlling the amount of fuel injected into a combustion engine, characterized in that the piezoelectric element is controlled based upon the charge it is carrying.

Another object of an exemplary embodiment of a method of the present invention is directed to providing the above method, characterized in that a measured value of a current flowing into the piezoelectric element is obtained and used for determining the charge the piezoelectric element is carrying.

Still another object of an exemplary embodiment of a method of the present invention is directed to providing the above method, characterized in that a measured value of a current flowing into the piezoelectric element via a current sensor is obtained.

Yet another object of an exemplary embodiment of a method of the present invention is directed to providing the above method, characterized in that the current sensor comprises a bridge circuit.

Still another object of an exemplary embodiment of a method of the present invention is directed to providing the above method, characterized in that the current sensor is calibrated.

Yet another object of an exemplary embodiment of a method of the present invention is directed to providing the above method, characterized in that the measured value of the current flowing into the piezoelectric element via an integrator is integrated.

Still another object of an exemplary embodiment of a method of the present invention is directed to providing the above method, characterized in that the integrator is calibrated.

Yet another object of an exemplary embodiment of a method of the present invention is directed to providing the above method, characterized in that the integrator is calibrated using at least one of a first calibration, a second calibration and a third calibration.

Still another object of an exemplary embodiment of a method of the present invention is directed to providing the above method, characterized in that the first calibration calibrates a reference voltage.

Yet another object of an exemplary embodiment of a method of the present invention is directed to providing the above method, characterized in that the second calibration calibrates a bridge circuit arrangement.

Still another object of an exemplary embodiment of a method of the present invention is directed to providing the above method, characterized in that the third calibration calibrates a time constant of the integrator.

Yet another object of an exemplary embodiment of a method of the present invention is directed to providing a fuel injection system having a piezoelectric element for controlling the amount of fuel injected into a combustion engine, characterized in that the piezoelectric element is controlled based upon the charge it is carrying.

Further advantages of the exemplary embodiments of the present inventions are also evidenced by the claims, including the dependent claims, and the present description, including the referenced figures.

The present invention(s) are described and explained in detail with reference to the exemplary embodiments and to the referenced figures.

FIG. 7b shows an exemplary embodiment of a voltage gradient controller that may be used in the control arrangement D of FIG. 4 and FIG. 7a.

FIG. 7c shows a block diagram of a capacitance determining arrangement that may be used in the control arrangement D of FIG. 4 and FIG. 7a.

FIG. 7e shows an exemplary embodiment of a voltage controller that may be used in the control arrangement D of FIG. 4 and FIG. 7a.

FIG. 10a shows a graph depicting an injection cycle for a piezoelectric actuator or element.

FIG. 10b shows a graph representing injection control valve position corresponding to the injection cycle of FIG. 10a.

FIG. 10c shows a graph depicing strobe pulses corresponding to the injection cycle of FIG. 10a.

FIG. 10d shows a graph depicting charge quantity measurement timing pulses corresponding to the injection cycle of FIG. 10a.

Figure 1:
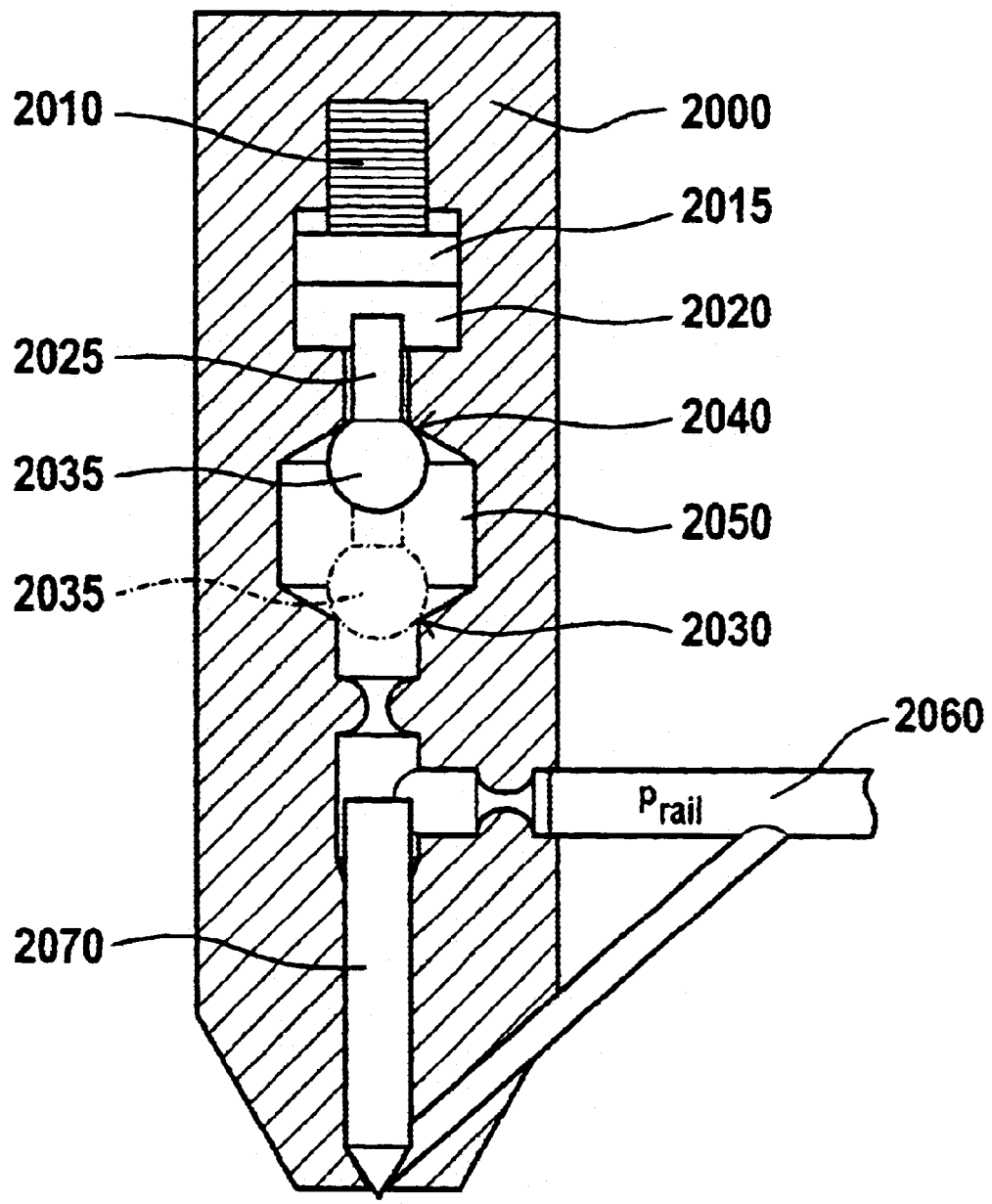
FIG. 1 shows an exemplary embodiment of a fuel injector which may be used with the exemplary embodiments of the present inventions.

In FIG. 1 is shown a schematic representation of an exemplary embodiment of a fuel injector 2000 having a piezoelectric actuator or element 2010. As shown, the piezoelectric element 2010 may be electrically energized to expand and contract in response to an activation voltage. The piezoelectric element 2010 is coupled to a piston 2015. In the expanded state, the piezoelectric element 2010 causes the piston 2015 to protrude into a hydraulic adapter 2020 which contains a hydraulic fluid, for example fuel. As a result of the piezoelectric element's expansion, a double acting control valve 2025 is hydraulically pushed away from hydraulic adapter 2020 and the valve plug 2035 is extended away from a first closed position 2040. The combination of double acting control valve 2025 and hollow bore 2050 is often referred to as double acting, double seat valve for the reason that when piezoelectric element 2010 is in an unexcited state, the double acting control valve 2025 rests in its first closed position 2040. On the other hand, when the piezoelectric element 2010 is fully extended, it rests in its second closed position 2030. The later position of valve plug 2035 is schematically represented with ghost lines in FIG. 1.

The fuel injection system comprises an injection needle 2070 allowing for injection of fuel from a pressurized fuel supply line 2060 into the cylinder (not shown). When the piezoelectric element 2010 is unexcited or when it is fully extended, the double acting control valve 2025 rests respectively in its first closed position 2040 or in its second closed position 2030. In either case, the hydraulic rail pressure maintains injection needle 2070 at a closed position. Thus, the fuel mixture does not enter into the cylinder (not shown). Conversely, when the piezoelectric element 2010 is excited such that double acting control valve 2025 is in the so-called mid-position with respect to the hollow bore 2050, then there is a pressure drop in the pressurized fuel supply line 2060. This pressure drop results in a pressure differential in the pressurized fuel supply line 2060 between the top and the bottom of the injection needle 2070 so that the injection needle 2070 is lifted allowing for fuel injection into the cylinder (not shown).

Figure 2:
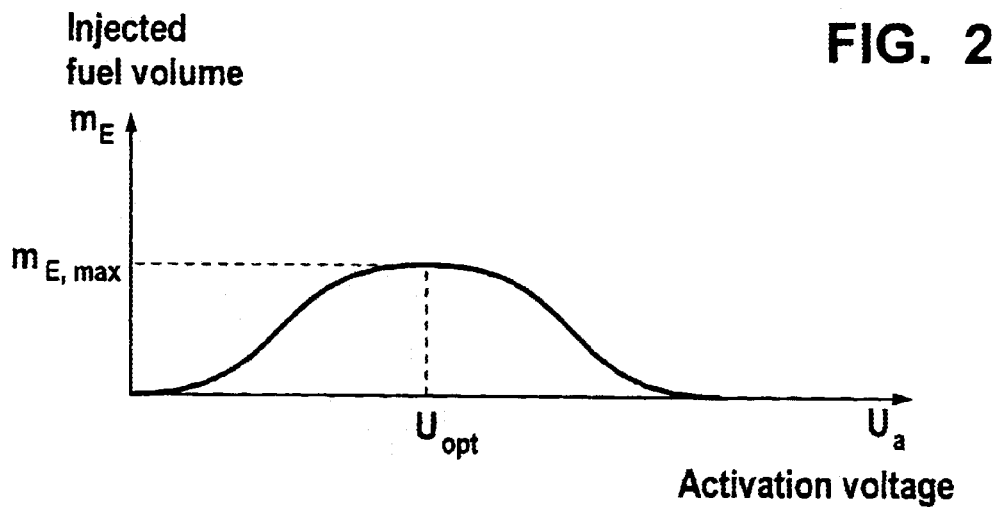
FIG. 2 shows a graph of the relationship between an activation voltage and an injected fuel volume during a preselected time period.

In FIG. 2 is shown a graph of a relationship between an activation voltage $U_a$ and an injected fuel volume $m_E$ during a preselected time period for a fuel injection system, which may, for example, use piezoelectric actuators or elements that control double-acting, double-seat control valves. The y-axis represents a volume $m_E$ of fuel that is injected into a cylinder chamber during the preselected period of time, which may be fixed. The x-axis represents the activation voltage $U_a$, which is applied to or stored in the corresponding piezoelectric actuator or element, which may be used to displace a valve plug of a control valve, such as a double-acting, double seat control valve.

When the activation voltage is zero, the valve plug of the control valve is in a first closed position and is therefore seated in a first one of the double-valve seats to prevent the flow of fuel during the preselected period of time. Activation voltages $U_a$ that are greater than zero and less than an optimal voltage $U_{opt}$ cause the displacement of the valve plug away from the first seat or the first closed position and toward the second seat or the second closed position. This results in a greater volume of injected fuel for the time period, and as the activation voltage $U_a$ approaches $U_{opt}$, the volume approaches a maximum volume, which is indicated as $m_{E,max}$ on the y-axis. The point $m_{E,max}$, corresponds to a maximum volume of the injected fuel during the preselected period of time and also, corresponds to the optimal activation voltage, which is applied to or used to charge the piezoelectric actuator or element. This results in an optimal displacement of the valve plug between the first and second valve seats.

As the activation voltage $U_a$ increases above $U_{opt}$, the volume of fuel injected during the preselected fixed period of time decreases until it reaches zero. That is, the valve plug moves away from its optimal point or position and toward the second closed position or seat of the double-acting, double-seat control valve until the valve plug is seated against the second valve seat. Thus, FIG. 2 shows that a maximum volume of injected fuel occurs when the activation voltage causes the piezoelectric actuator or element to displace the valve plug to its optimal point or position.

The optimal activation voltage $U_{opt}$ at any given time for a particular piezoelectric actuator or element, however, may be influenced by its manufacturing characteristics and by any of its aging effects. That is, the displacement caused by the piezoelectric actuator or element for a certain activation voltage may vary based on or as a function of the various operating characteristics (such as the manufacturing and aging characteristics) of the particular piezoelectric actuator or element. Accordingly, to maximize the volume of injected fuel during a particular period of time, the activation voltage applied to or occurring in the piezoelectric actuator or element should be set to a value that reflects the current operating characteristics of the particular piezoelectric actuator or element and that reflects the optimal activation voltage.

Figure 3:
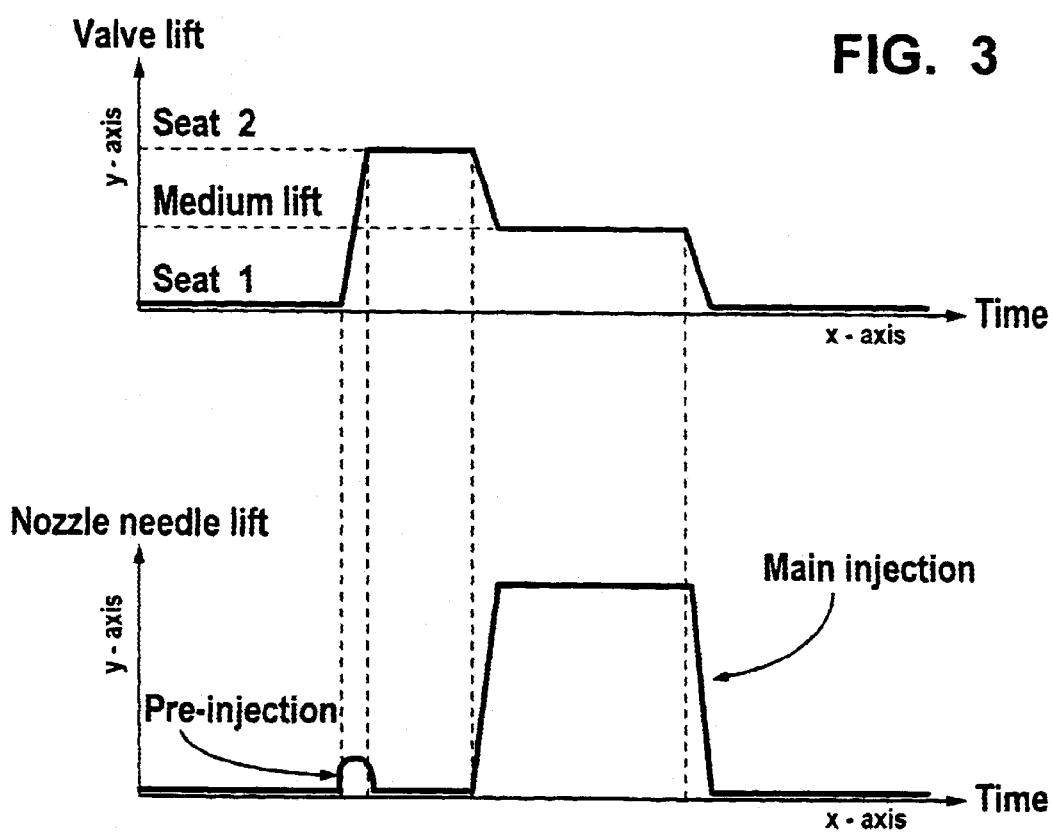
FIG. 3 shows a double graph representing a schematic profile of an exemplary control valve stroke, in which valve lift and nozzle needle lift are shown with respect to time.

In FIG. 3 is shown a double graph of a schematic profile representing an exemplary control valve stroke for the operation of the double-acting, the double-seat control valve discussed above. In the upper graph, the x-axis represents time and the y-axis represents a displacement of the valve plug, which is "valve lift". In the lower graph, the x-axis also represents time and the y-axis represents "nozzle needle lift" for providing fuel flow that results from the corresponding valve lift of the upper graph. As shown, the x-axis of the upper graph and x-axis of the lower graph are aligned to coincide in time.

During fuel injection cycle, the piezoelectric actuator or element is charged so that the piezoelectric actuator or element expands and therefore causes the corresponding valve plug to move from the first seat to the second seat for a pre-injection stroke, as shown in the upper graph of FIG. 3. The lower graph of FIG. 3 shows a small injection or pre-injection of fuel that occurs as the valve plug moves between the two seats, which opens and closes the control valve. The piezoelectric element may be charged in two steps by charging it to a certain voltage to cause the valve to open and then charging it further to cause the valve to close again at the second seat. Between these steps, there may be a certain time delay.

After a preselected period of time, the piezoelectric actuator or element is discharged to reduce the charge within the piezoelectric actuator or element so that it contracts and causes the valve plug to move away from the second seat and toward a mid-point or position between the two seats, at which it holds. As in FIG. 2, the activation voltage within the piezoelectric actuator or element reaches a value $U_{opt}$, which corresponds to an optimal point of the valve lift, and thereby maximizes the fuel flow during a period of time for a main fuel injection operation. The upper and lower graphs of FIG. 3 show the holding of the valve lift at a midway point (that is, the medium lift point) to provide the main fuel injection operation.

At the end of the main fuel injection operation, the piezoelectric actuator or element is discharged to an activation voltage of zero and it further contracts so that the valve plug moves away from the optimal point or position and toward the first seat, which closes the control valve and stops fuel flow, and which is shown in the upper and lower graphs of FIG. 3. At this time, the valve plug is again in a position to repeat another pre-injection and main injection cycle, as is described above. Of course, any suitably appropriate injection cycle may be used.

Figure 4:
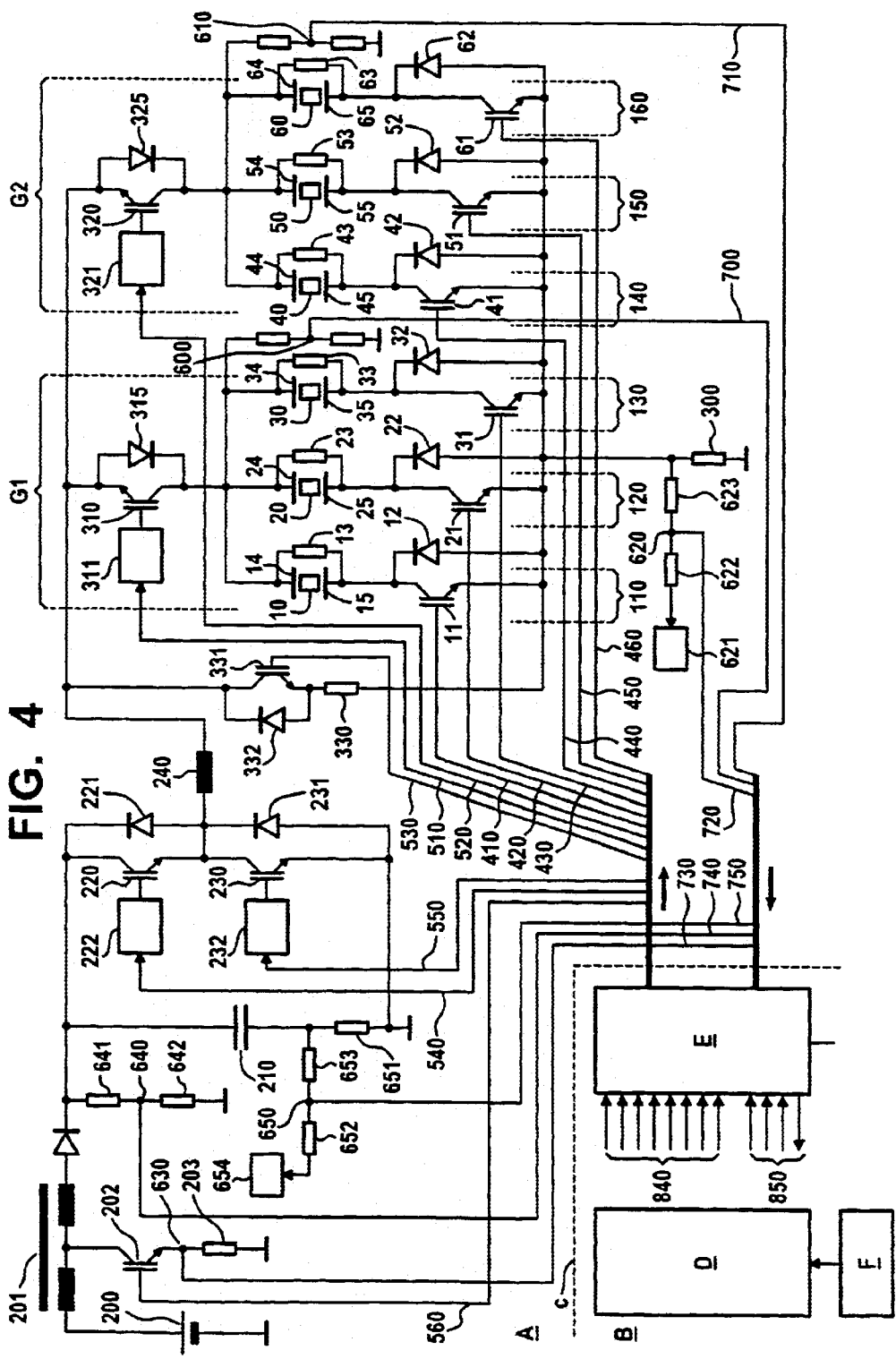
FIG. 4 shows a block schematic diagram concerning an exemplary embodiment of a fuel injection control system, which may include exemplary embodiments of the apparatuses, arrangements and/or methods of the present inventions.

In FIG. 4 is shown a schematic diagram of an exemplary embodiment of a fuel injection control system 100, which may include the exemplary embodiments of the apparatuses, methods and systems of the present inventions.

More particularly, and as it is shown, the fuel injection control system 100 includes a circuit arrangement "A" and an activation, control and measuring arrangement "B", which includes the control arrangement or unit "D", the activation arrangement "E" and a measuring arrangement "F". The separation of the A and B arrangements is indicated by a dashed line "c". The circuit arrangement A may be used to charge and discharge six piezoelectric elements 10, 20, 30, 40, 50, 60. The piezoelectric elements 10, 20, 30, 40, 50, 60 are used as actuators in fuel injection nozzles (which may be, for example, "common rail" injectors) of an internal combustion engine. Piezoelectric actuators or elements may be used because, as discussed above, they contract or expand as a function of a voltage applied to or occurring in them. As shown, the six piezoelectric actuators or elements 10, 20, 30, 40, 50, 60 are used in the exemplary embodiment to independently control six cylinders in a combustion engine. Any suitably appropriate number of piezoelectric elements may be used, of course, depending on the particular application.

As discussed, the activation, control and measuring arrangement B includes the control arrangement or unit "D" and the activation arrangement or unit "E", which are used to control the various components or elements in the circuit arrangement A, circuit), and the measuring arrangement or system "F", which may be used to measure various system operating characteristics (such as, for example, fuel pressure and rotational speed (rpm) of the internal combustion engine for input to and use by the control arrangement D, as will be further described below). The control arrangement or unit D and the activation arrangement or unit E may be programmed to control activation voltages for the piezoelectric actuators or elements as a function of the operating characteristics of each of the particular piezoelectric actuators or elements. Such "programming" may be done, for example, in software using a microcontroller or a microprocessor arrangement in the control arrangement D, and may also be done using any suitably appropriate "processor" arrangement, such as, for example, an ASIC in the activation arrangement E.

The following description first describes the components or elements in the circuit arrangement A, and then describes the methods or procedures for charging and discharging the piezoelectric elements 10, 20, 30, 40, 50, 60. Finally, it describes how both procedures are controlled by the control arrangement D and the activation arrangement E.

As discussed, the circuit arrangement A may include six piezoelectric elements 10, 20, 30, 40, 50, 60. The piezoelectric elements 10, 20, 30, 40, 50, 60 may be arranged or distributed into a first group "G1" and a second group "G2", each of which may include three piezoelectric elements (that is, the piezoelectric elements 10, 20 and 30 may be arranged in the first group G1 and the piezoelectric elements 40, 50, 60 may be arranged in the second group G2). The groups G1 and G2 are constituents of circuit sub-systems that are connected in parallel with each other.

Group selector switches 310, 320 may be used to select which of the groups G1 and G2, which include respectively the piezoelectric elements 10, 20, 30 and the piezoelectric elements 40, 50, 60, will be discharged by a common charging and discharging arrangement or apparatus in the circuit arrangement A. As shown, the group selector switches 310, 320 may be arranged between a coil 240 and the coil-side terminals of their respective groups G1 and G2, and may be implemented as transistors in the exemplary embodiment of FIG. 4. Side drivers 311, 321 may be used to transform control signals, which are received from the activation arrangement E, into suitably appropriate voltages for closing and opening the group selector switches 310, 320.

Group selector diodes 315, 325 are provided in parallel with the group selector switches 310, 320, respectively. If, for example, the group selector switches 310, 320 are implemented as MOSFETs or IGBTs, the group selector diodes 315, 325 may be the parasitic diodes of the MOSFETS or IGBTs. The group selector diodes 315, 325 bypass the group selector switches 310, 320 during charging procedures. Thus, the group selector switches 310, 320 only select a group G1, G2, which include respectively the piezoelectric elements 10, 20, 30 and the piezoelectric elements 40, 50, 60, for the discharging procedure.

Within each group G1, G2 the piezoelectric elements 10, 20, 30 and the piezoelectric elements 40, 50, 60 are arranged as constituents of piezoelectric branches 110, 120, 130 (corresponding to group G1) and 140, 150, 160 (corresponding to group G2) that are connected in parallel. Each of the piezoelectric branch includes a series circuit having a first parallel circuit, which includes a corresponding one of the piezoelectric elements 10, 20, 30, 40, 50, 60 and a corresponding one of branch resistors 13, 23, 33, 43, 53, 63, and a second parallel circuit having a selector switch, which may be implemented as a corresponding one of branch selector switches 11, 21, 31, 41, 51, 61 (which may be transistors), and a corresponding one of branch selector diodes 12, 22, 32, 42, 52, 62.

The branch resistors 13, 23, 33, 43, 53, 63 cause each corresponding piezoelectric element 10, 20, 30, 40, 50, 60 to continuously discharge during and after a charging procedure, since the branch resistors connect both terminals of their corresponding and capacitive piezoelectric element 10, 20, 30, 40, 50, 60. The branch resistors 13, 23, 33, 43, 53, 63 are sufficiently large to make this procedure relatively slow as compared to the controlled charging and discharging procedures, which are further described below. It is therefore reasonable to consider that the charge of any piezoelectric element 10, 20, 30, 40, 50, 60 is relatively stable or unchanging in a relevant time period occurring after a charging procedure. The branch resistors 13, 23, 33, 43, 53, 63 are used to remove remaining charges on the piezoelectric elements 10, 20, 30, 40, 50, 60 if, for example, the system fails or other critical or exceptional situations occur. The branch resistors 13, 23, 33, 43, 53, 63 are therefore not further discussed in the following description.

The branch selector switch and the branch diode pairs in the piezoelectric branches 110, 120, 130, 140, 150, 160 (that is, selector switch 11 and diode 12 in piezoelectric branch 110, selector switch 21 and diode 22 in piezoelectric branch 120, and so on) may be implemented using electronic switches (such as, for example, transistors) having parasitic diodes, which may include, for example, MOSFETs or IGBTs (which, as referred to above, may also be used for the group selector switch and the diode pairs 310, 315 and 320, 325).

The branch selector switches 11, 21, 31, 41, 51, 61 may be used to select which of the piezoelectric elements 10, 20, 30, 40, 50, 60 is charged in each case by the common charging and discharging apparatus. The piezoelectric elements 10, 20, 30, 40, 50, 60 that are charged are all those whose branch selector switches 11, 21, 31, 41, 51, 61 are closed during the charging procedure. In the exemplary embodiment, only one of the branch selector switches is closed at a time.

The branch diodes 12, 22, 32, 42, 52, 62 bypass the branch selector switches 11, 21, 31, 41, 51, 61 during discharging procedures. Thus for charging procedures, any individual piezoelectric element may be selected, but for discharging procedures, either (or both) of the first group G1 or the second group G2 of the piezoelectric elements 10, 20, 30 and the piezoelectric elements 40, 50, 60 may be selected.

As further regards the piezoelectric elements 10, 20, 30, 40, 50, 60, branch selector piezoelectric terminals 15, 25, 35, 45, 55, 65 may be coupled to ground either through the branch selector switches 11, 21, 31, 41, 51, 61 or through the corresponding one of the branch diodes 12, 22, 32, 42, 52, 62, and, in both cases, through resistor 300.

The resistor 300 measures the currents (or charges) that flow, during the charging and discharging of the piezoelectric elements 10, 20, 30, 40, 50, 60, between the branch selector piezoelectric terminals 15, 25, 35, 45, 55, 65 and the ground. By measuring these currents (or charges), the charging and discharging of the piezoelectric elements 10, 20, 30, 40, 50, 60 may be controlled. In particular, by closing and opening a charging switch 220 and a discharging switch 230 in a way that depends on the magnitude of the measured currents, the charging current and the discharging current may be controlled or set to predefined average values, and/or these currents may be kept from exceeding or falling below predefined maximum and/or minimum values, as is further explained below.

In the exemplary embodiment, the currents may be measured by using a voltage source 621 (which may, for example, supply a voltage of 5 V DC) and a voltage divider, which may be implemented using two resistors 622 and 623. This should protect the activation arrangement E (which measures the currents or voltages) from negative voltages, which might otherwise occur at measuring point 620 and which cannot be handled by the activation arrangement E. In particular, negative voltages may be changed into positive voltages by adding a positive voltage, which may be supplied by the voltage source 621 and the voltage divider resistors 622 and 623.

The other terminal of each piezoelectric element 10, 20, 30, 40, 50, 60 (that is, group selector piezoelectric terminal 14, 24, 34, 44, 54, 64) may be connected to the positive pole or terminal of a voltage source via the group selector switch 310, 320 or via the group selector diode 315, 325, as well as via the coil 240 and a parallel circuit arrangement having the charging switch 220 and a charging diode 221, and alternatively or additionally may be coupled to ground via the group selector switch 310, 320 or via diode 315, 325, as well as via the coil 240 and a parallel circuit arrangement having the discharging switch 230 and a discharging diode 231. The charging switch 220 and the discharging switch 230 may be implemented as transistors, for example, which are controlled respectively via side drivers 222 and 232.

The voltage source may include a capacitive element which, in the exemplary embodiment, may be the (buffer) capacitor 210. The capacitor 210 is charged by a battery 200 (such as, for example, a motor vehicle battery) and a DC voltage converter 201, that is located downstream from the voltage source 200. The DC voltage converter 201 converts the battery voltage (such as, for example, 12 V) into any other suitably appropriate DC voltage (such as, for example, 250 V), and charges the capacitor 210 to the converted voltage. The DC voltage converter 201 may be controlled by a transistor switch 202 and a resistor 203, which may be used to measure current at a measuring point 630.

To cross-check the current measurements, another current measurement at a measuring point 650 may be provided by the activation arrangement E, as well as by resistors 651, 652 and 653 and a voltage source 654, which may be, for example, a 5 V DC voltage source. Also, a voltage measurement at a measuring point 640 may be provided by the activation arrangement E, as well as by voltage dividing resistors 641 and 642.

Finally, a "total" discharging resistor 330, a "stop" switch 331 (which may be implemented as a transistor) and a "total" discharging diode 332 may be used to discharge "completely" or sufficiently the piezoelectric elements 10, 20, 30, 40, 50, 60 when these elements are not adequately discharged by the "normal" discharging operation described further below. The stop switch 331 may preferably be closed after the "normal" discharging procedures (that is, the cycled discharging via the discharge switch 230), which couples the piezoelectric elements 10, 20, 30, 40, 50, 60 to the ground through the resistors 330 and 300. This should remove any residual charges that may remain in the piezoelectric elements 10, 20, 30, 40, 50, 60. The total discharging diode 332 is intended to prevent negative voltages from occurring at the piezoelectric elements 10, 20, 30, 40, 50, 60, which might otherwise be damaged by such negative voltages.

The charging and discharging of all or any one of the piezoelectric elements 10, 20, 30, 40, 50, 60 may be done by using a charging and discharging apparatus that may be common to each of the groups and their corresponding piezoelectric elements. In the exemplary embodiment, the common charging and discharging apparatus of the circuit arrangement A may include the battery 200, the DC voltage converter 201, the capacitor 210, the charging switch 220, the discharging switch 230, the charging diode 221, the discharging diode 231 and the coil 240.

Figure 5A:
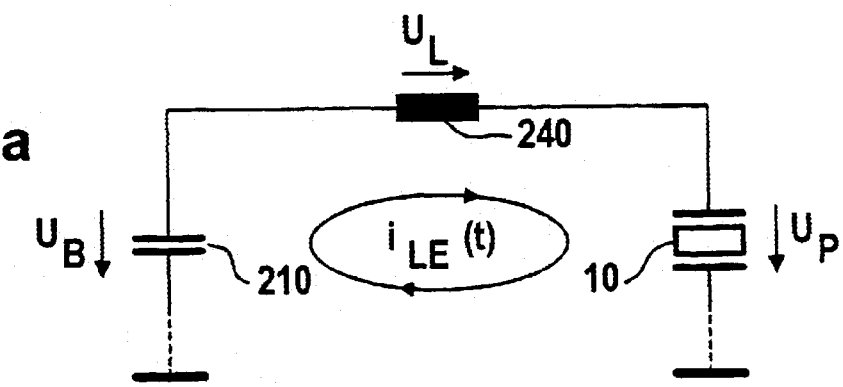
FIG. 5a shows the conditions occurring during a first charging phase in the control system of FIG. 4.
Figure 5B:
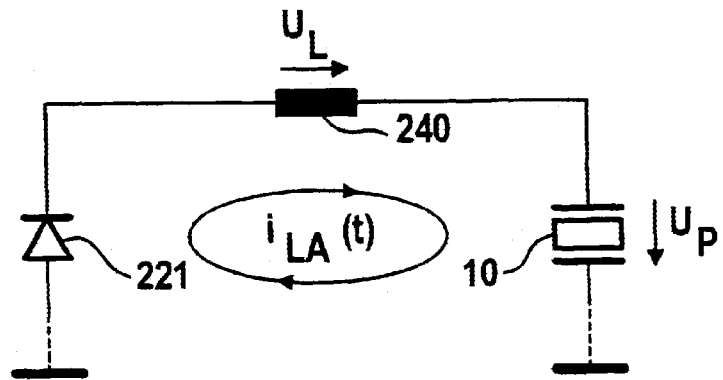
FIG. 5b shows the conditions occurring during a second charging phase in the control system of FIG. 4.
Figure 5C:
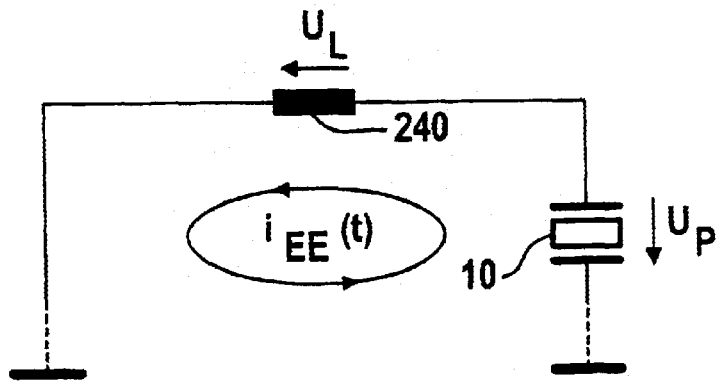
FIG. 5c shows the conditions occurring during a first discharging phase in the control system of FIG. 4.
Figure 5D:
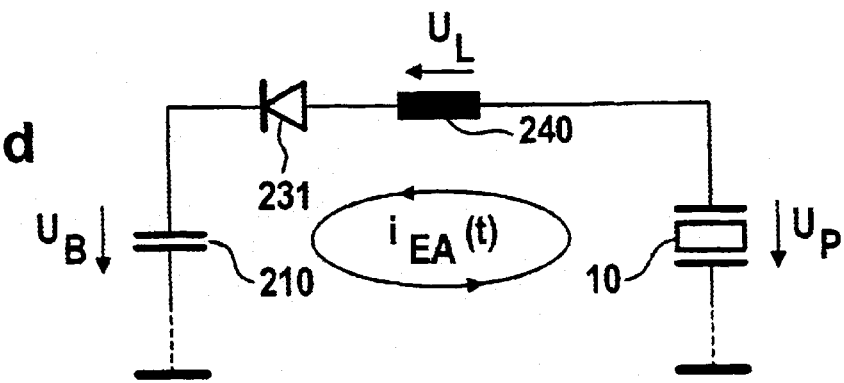
FIG. 5d shows the conditions occurring during a second discharging phase in the control system of FIG. 4.

The charging and discharging of each piezoelectric element is the same and is therefore explained as follows with respect to only the first piezoelectric element 10. The conditions occurring during the charging and discharging procedures are explained with reference to FIGS. 5a through 5d. In particular, FIGS. 5a and 5b show the charging of the piezoelectric element 10 and FIGS. 5c and 5d show the discharging of the piezoelectric element 10.

The selection of one or more particular piezoelectric elements 10, 20, 30, 40, 50, 60 to be charged or discharged and the charging and discharging procedures may be controlled or driven by the activation arrangement E and/or the control arrangement D by opening or closing one or more of the branch selector switches 11, 21, 31, 41, 51, 61, the group selector switches 310, 320, the charging and discharging switches 220, 230 and the stop switch 331. The interactions of the elements of the circuit arrangement A with respect to the activation arrangement E and the control arrangement D are described further below.

Concerning the charging procedure, the system first selects a particular piezoelectric element 10, 20, 30, 40, 50, 60 that is to be charged. To exclusively charge the first piezoelectric element 10, the branch selector switch 11 of the first branch 110 is closed and all other branch selector switches 21, 31, 41, 51, 61 remain open. To exclusively charge any other piezoelectric element 20, 30, 40, 50, 60 or to charge several ones at the same time, the appropriate piezoelectric element or elements may be selected by closing the corresponding one or ones of the branch selector switches 21, 31, 41, 51, 61.

In the exemplary embodiment, the charging procedure requires a positive potential difference between the capacitor 210 and the group selector piezoelectric terminal 14 of the first piezoelectric element 10. When the charging switch 220 and the discharging switch 230 are open, however, there is no charging or discharging of the piezoelectric element 10. In this state, the system of FIG. 4 is in a steady-state condition so that the piezoelectric element 10 at least substantially retains its charge state so that no substantial current flows.

To charge the first piezoelectric element 10, the charging switch 220 is closed. While the first piezoelectric element 10 may be charged by just closing the switch, this may produce sufficiently large currents that could damage the components or elements involved. Therefore, the currents are measured at measuring point 620, and switch 220 is opened when the measured currents exceed a certain limit or threshold. To achieve desired charge on the piezoelectric element 10, the charging switch 220 is repeatedly closed and opened and the discharging switch 230 is kept open.

When the charging switch 220 is closed, the conditions of FIG. 5a occur. That is, a closed series circuit forms that includes the piezoelectric element 10, the capacitor 210 and the coil 240, in which a current $i_{LE}(t)$ flows as indicated by arrows in FIG. 5a. As a result of this current flow, positive charges flow to the group selector piezoelectric terminal 14 of the piezoelectric element 10 and energy is stored in the coil 240.

When the charging switch 220 opens relatively shortly (such as, for example, a few $\mu s$) after it has closed, the conditions shown in FIG. 5b occur. That is, a closed series circuit forms that includes the piezoelectric element 10, the charging diode 221 and the coil 240, in which a current $i_{LA}(t)$ flows as indicated by arrows in FIG. 5b. As a result of this current flow, the energy stored in the coil 240 flows into the piezoelectric element 10. Corresponding to the charge or energy delivery to the piezoelectric element 10, the voltage and the external dimensions of the piezoelectric element 10 correspondingly increase. When energy has been transferred from coil 240 to the piezoelectric element 10, a steady-state condition of the system the FIG. 4 is again attained.

At that time (or earlier or later depending on the desired time profile of the charging operation), the charging switch 220 is again closed and opened so that the processes described above are repeated. As a result of the re-closing and reopening of the charging switch 220, the energy stored in the piezoelectric element 10 increases (that is, the newly delivered energy is added to the energy already stored in the piezoelectric element 10), and the voltage and the external dimensions of the piezoelectric element correspondingly increase.

By repeatedly closing and opening the charging switch 220, the voltage occurring at the piezoelectric element 10 and the expansion of the piezoelectric element 10 rise in a stepwise manner. When the charging switch 220 has closed and opened a predefined number of times and/or when the piezoelectric element 10 reaches the desired charge state, the charging of the piezoelectric element 10 is terminated by leaving the charging switch 220 open.

Concerning the discharging procedure, in the exemplary embodiment of FIG. 4, the piezoelectric elements 10, 20, 30, 40, 50, 60 may be discharged in groups (G1 and/or G2) as follows:

First, the group selector switch(es) 310 and/or 320 of the group(s) G1 and/or G2 (the piezoelectric elements of which are to be discharged) are closed. The branch selector switches 11, 21, 31, 41, 51, 61 do not affect the selection of the piezoelectric elements 10, 20, 30, 40, 50, 60 for the discharging procedure since they are bypassed by the branch diodes 12, 22, 32, 42, 52 and 62. Thus, to discharge the piezoelectric element 10 of the first group G1, the first group selector switch 310 is closed.

When the discharging switch 230 is closed, the conditions shown in FIG. 5c occur. That is, a closed series circuit forms that includes the piezoelectric element 10 and the coil 240, in which a current $i_{EE}(t)$ flows as indicated by arrows in FIG. 5c. As a result of this current flow, the energy (or at least a portion thereof) stored in the piezoelectric element 10 is transferred into the coil 240. Corresponding to the energy transfer from the piezoelectric element 10 to the coil 240, the voltage occurring at the piezoelectric element 10 and its external dimensions decrease.

When the discharging switch 230 opens relatively shortly (such as, for example, a few $\mu s$) after it has closed, the conditions shown in FIG. 5d occur. That is, a closed series circuit forms that includes the piezoelectric element 10, the capacitor 210, the discharging diode 231 and the coil 240, in which a current $i_{EA}(t)$ flows as indicated by arrows in FIG. 5d. As a result of this current flow, energy stored in the coil 240 is fed back into the capacitor 210. When the energy is transferred from the coil 240 to the capacitor 210, the steady-state condition of the system of FIG. 4 is again attained.

At that time (or earlier or later depending on the desired time profile of the discharging operation), the discharging switch 230 is again closed and opened so that the processes described above are repeated. As a result of the re-closing and re-opening of the discharging switch 230, the energy stored in the piezoelectric element 10 decreases further, and the voltage occurring at the piezoelectric element and its external dimensions decrease correspondingly.

By repeatedly closing and opening of the discharging switch 230, the voltage occurring at the piezoelectric element 10 and the expansion of the piezoelectric element 10 decrease in a step-wise manner. When the discharging switch 230 has closed and opened a predefined number of times and/or when the piezoelectric element 10 has reached the desired discharge state, the discharging of the piezoelectric element 10 is terminated by leaving open the discharging switch 230.

The interaction of the activation arrangement or unit E and the control arrangement or unit D with respect to the circuit arrangement A is controlled by control signals, which the activation arrangement E provides to the components or elements of the circuit arrangement A via branch selector control lines 410, 420, 430, 440, 450, 460, group selector control lines 510, 520, stop switch control line 530, charging switch control line 540, discharging switch control line 550 and control line 560. The measured currents or sensor signals obtained at the measuring points 600, 610, 620, 630, 640, 650 of the circuit arrangement A are provided to the activation arrangement E via sensor lines 700, 710, 720, 730, 740, 750.

Each of the control lines may be used to apply (or not apply) voltages to the base of a corresponding transistor switch to select a corresponding one of the piezoelectric elements 10, 20, 30, 40, 50, 60 and to charge or discharge one or more of the piezoelectric elements 10, 20, 30, 40, 50, 60 by opening and closing their corresponding switches, as described above. The sensor signals may be used to determine the resulting voltage of the piezoelectric elements 10, 20, 30 of group G1 or of the piezoelectric elements 40, 50, 60 of group G2 the measuring points 600, 610 and the charging and discharging currents from the measuring point 620. The control arrangement D and the activation arrangement E operate using the control and sensor signals, as is now described.

As is shown in FIG. 4, the control arrangement D and the activation arrangement E are coupled together by a parallel bus 840 and also by a serial bus 850. The parallel bus 840 may be used for relatively fast transmission of the control signals from the control arrangement D to the activation arrangement E, and the serial bus 850 may be used for relatively slower data transfers.

Figure 6:
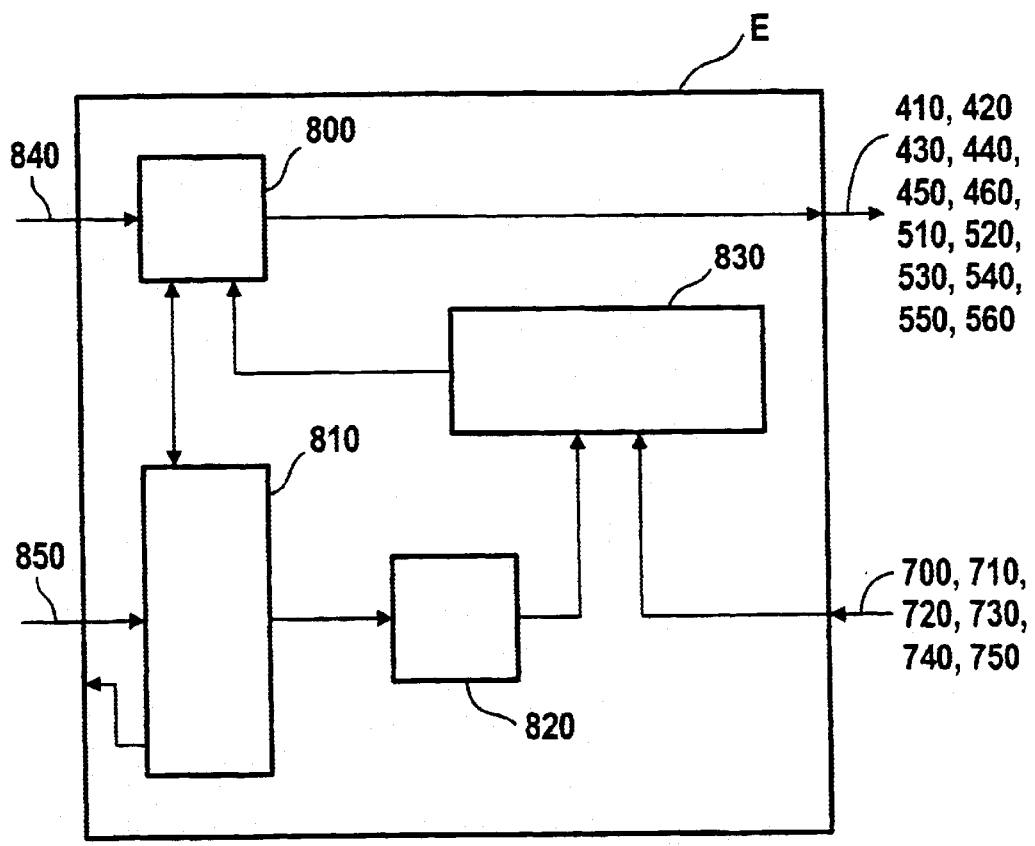
FIG. 6 shows a block diagram of an activation or driver arrangement, which may be an integrated circuit and which may be used in the control system of FIG. 4.

As shown in FIG. 6, the activation arrangement E (which may be an integrated circuit, such as, for example, an application specific integrated circuit or ASIC) may include a logic circuit 800, a memory 810 (which may be, for example, a RAM type memory), a digital-to-analog converter arrangement or system 820 and a comparator arrangement or system 830. The faster parallel bus 840 (which may be used for the control signals) may be coupled to the logic circuit 800 and the slower serial bus 850 may be coupled to the memory 810. The logic circuit 800 may be coupled to the memory 810, to the comparator system 830 and to following the signal lines: 410, 420, 430, 440, 450 and 460; 510 and 520; 530; 540, 550 and 560. The memory 810 may be coupled to the logic circuit 800 and to the digital-to-analog converter system 820. The digital-to-analog converter system 820 may also be coupled to the comparator system 830, which may be coupled to the sensor lines 700, 710, 720, 730, 740 and 750, and to the logic circuit 800.

The activation arrangement E of FIG. 6 may be used in the charging procedure, for example, as follows:

The control arrangement D and the activation arrangement E operate as follows to determine or select a particular piezoelectric element 10, 20, 30, 40, 50, 60 that is to be charged to a certain desired or target voltage. First, the value of the target voltage (expressed by a digital number) is transmitted to the memory 810 via the serial bus 850. The target voltage may be, for example, the optimal activation voltage $U_{opt}$ that may be used in a main injection operation, as described above with respect to FIG. 2. Later or simultaneously, a code corresponding to the particular piezoelectric element 10, 20, 30, 40, 50, 60 that is to be selected and the address or source of the desired or target voltage within the memory 810 may be transmitted to the logic circuit 800. A start signal, which may be a strobe signal, may then be sent to the logic circuit 800 via the parallel bus 840 to start the charging procedure.

Based on the start signal, the logic circuit 800 causes the digital value of the desired or target voltage from the memory 810 to be transmitted to the digital-to-analog converter system 820, which outputs an analog signal of the desired voltage to the comparator system 830. The logic circuit 800 may also select either sensor signal line 700 for the measuring point 600 (for any of the piezoelectric elements 10, 20, 30 of the first group G1) or the sensor signal line 710 for the measuring point 610 (for any of the piezoelectric elements 40, 50, 60 of the second group G2) to provide the measured voltage (or current) to the comparator system 830. The desired or target voltage and the measured voltage at the selected piezoelectric element 10, 20, 30, 40, 50, 60 may then be compared by the comparator system 830, which may then transmit the results of the comparison result (that is, the difference between the target voltage and the measured voltage) to the logic circuit 800. The logic circuit 800 may stop the charging procedure when the desired or target voltage and the voltage (or current) are equal or sufficiently the same.

Next, the logic circuit 800 applies a control signal using the sensing line 720 to one (or more) of the branch selector switches 11, 21, 31, 41, 51, 61, which corresponds to one of the selected piezoelectric elements 10, 20, 30, 40, 50, 60 to close the switch. All branch selector switches 11, 21, 31, 41, 51, 61 are considered to be in an open state before the start of the charging procedure in the exemplary embodiment. The logic circuit 800 then applies a control signal on the control line 540 to the charging switch 220 to close the switch. The logic circuit 800 also starts (or continues) measuring any currents at the measuring point 620 using sensing line 720. The measured voltages (or currents) are then compared to a suitably appropriate predefined maximum value by the comparator system 830. When the predefined maximum value is reached by the measured voltages (or currents), the logic circuit 800 causes the charging switch 220 to open again.

The system then measures any remaining currents at the measuring point 620 using the sensing signal line 720 and compares to a suitably appropriate predefined minimum value. When the predefined minimum value is reached, the logic circuit 800 causes the charging switch 220 to close again and the charging procedure may start again.

Using control line 540, the repeated closing and opening of the charging switch 220 is done if the measured voltage at the measuring point 600 or 610 is below the desired or target voltage. When the desired or target voltage is reached, the logic circuit 800 may stop the charging procedure.

The discharging procedure is performed in a similar manner. The logic circuit 800 selects the piezoelectric elements 10, 20, 30, 40, 50, 60 using the control lines 510, 520 to switch the group selector switches 310, 320. Using control line 550, the discharging switch 230 (instead of the charging switch 220) is opened and closed until a suitably appropriate predefined minimum target voltage is reached.

In the system, the timing of the charging and discharging operations and the holding of the midpoint voltage levels for the piezoelectric elements 10, 20, 30, 40, 50, 60, such as, for example, during the time of a main injection operation, may be done according to the exemplary valve stroke shown in FIG. 3.

When the piezoelectric elements are used as actuators in a fuel injection control system, the injected fuel volume is based on or is a function of the determined time period that the control valve is open (which, as discussed, is determined by the fuel injection metering block 2509) and the activation voltage applied to the piezoelectric element during the determined time period. Also, by obtaining the optimal activation voltage $U_{opt}$ during the time period of the main injection operation, the associated or corresponding voltage gradient may also be optimized since the relationship between a voltage gradient and fuel volume is analogous to the relationship between the activation voltage and fuel volume, as shown, for example, in FIG. 2.

Since the above description of the charging and/or discharging procedures is exemplary, any other suitably appropriate procedure using the above described exemplary arrangements (or other) may be used.

Figure 7A:
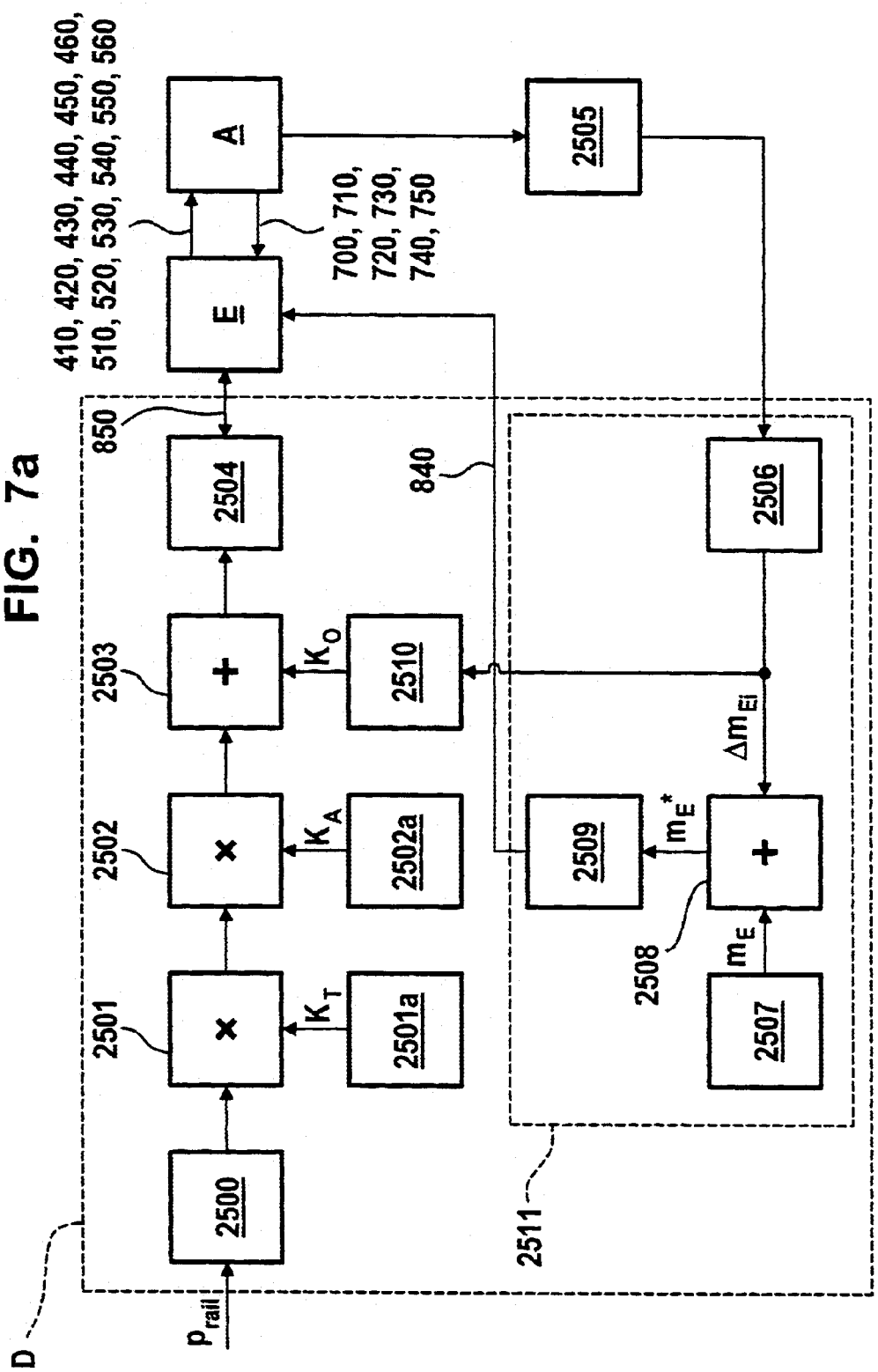
FIG. 7a shows a block diagram of the relationship among a circuit arrangement "A", a control arrangement "D", an activation arrangement "E" and an engine, and further shows various task blocks of the control arrangement D of FIG. 4.

In FIG. 7a is shown a block diagram of the fuel injection control system 100 of FIG. 4, including the relationship among the circuit arrangement A, an operating or task block layout of operations that may be implemented in the control arrangement D (the blocks may correspond software modules that are executed by the processor(s) of FIG. 6a) and the activation arrangement E. Also shown is the relationship of the operating or task blocks of the control arrangement D with respect to the activation arrangement E and an internal combustion engine 2505.

In particular, the control arrangement D may include a base voltage determination block 2500, a multiplier block 2501, a temperature compensation block 2501a, a multiplier block 2502, a piezoelectric operating characteristics compensation block 2502a, an adder block 2503 and a voltage and voltage gradient controller block 2504 (which is further shown in FIG. 7b), an "on-line" optimization unit 2510 and a fuel injection adjustment block 2511. The fuel injection adjustment block 2511 may include a fuel injection adjustment or correction block 2506, a desired fuel injection volume block 2507, an adder block 2508 and a fuel injection metering block 2509.

The control arrangement D first obtains measured information or signals corresponding to the fuel rail pressure. This may be done, for example, by having the control arrangement D obtain a sensed fuel rail pressure signal, which may be provided by a fuel rail pressure sensor that is configured to sense the fuel rail pressure, through an analog-to-digital converter. The base voltage determination block 2500 may then convert the digital fuel rail pressure information to a corresponding base voltage. To better ensure a more accurate target voltage, the base voltage may be adjusted based on the temperature and other characteristics of the piezoelectric element. As discussed, the other characteristics may include, for example, the particular operating characteristics when it is manufactured and the operating characteristics of the piezoelectric element as it ages. Accordingly, in the temperature compensation block 2501a, the control arrangement D may determine a compensation factor $K_T$ that may be applied to the base voltage using the multiplier block 2501. Analogously, in the operating characteristics compensation block 2502a, the control arrangement D may determine a characteristics compensation factor $K_A$ that may be applied to the base voltage using the multiplier block 2502.

As regards the temperature compensation block 2501a, the control arrangement D may perform the temperature compensation task, for example, in any one or more of the following ways. In one approach, an operating temperature of some vehicle system or component (such as, for example, a vehicle system coolant) that corresponds to an operating temperature of the piezoelectric element may be used as a "surrogate" or estimate of an actual operating temperature of the piezoelectric element. Thus, the control arrangement D may obtain the "surrogate" operating temperature and use it to obtain a temperature related voltage of the piezoelectric element from a stored characteristic curve, which may reflect, for example, a relationship between such a surrogate operating temperature and a corresponding voltage of the piezoelectric element that reflects the effect of the operating temperature. Using this information, the control arrangement D may determine a compensation factor based on a difference between the base voltage and the characteristic curve voltage that reflects the operating temperature effect. In another approach, the control arrangement D may first determine a capacitance of the piezoelectric element (as is further described herein), and then obtain an estimated temperature based on another characteristic curve of a relationship between the operating temperature and the capacitance of the piezoelectric element. The control arrangement D may then use the estimated temperature information to determine a temperature compensation factor based on a difference between the base voltage and a characteristic curve voltage that reflects the operating temperature effect.

As regards the operating characteristics compensation block 2502a, the control arrangement D may perform the operating characteristics compensation task, for example, in any one or more of the following ways. To compensate for aging effects, for example, an operating temperature of some vehicle system or component (such as, for example, a vehicle system coolant) that corresponds to an operating temperature of the piezoelectric element may be used as a "surrogate" or estimate of an actual operating temperature of the piezoelectric element. Thus, the control arrangement D may obtain the "surrogate" operating temperature and use it to obtain a temperature related capacitance of the piezoelectric element from a stored characteristic curve, which may reflect, for example, a relationship between such a surrogate operating temperature and a corresponding capacitance of the piezoelectric element that reflects the effect of the operating temperature. Using this information, the control arrangement D may determine an operating characteristic compensation factor based on a difference between a measured capacitance of the piezoelectric element (as is further described herein) and the characteristic curve capacitance that may reflect an aging effect. To compensate for the particular operating characteristics of a piezoelectric element when it is manufactured, such characteristics may first be measured and then input into the control arrangement D, which may then determine an operating characteristics compensation factor based on any differences between the operating characteristics of a particular piezoelectric element and the average, mean or "normal" operating characteristics of such a device.

The control arrangement D may include the fuel volume determination system 2511, which may include a fuel volume determination block 2507, which first determines an optimum fuel volume $m_E$ to inject into a cylinder and then outputs this value to the adder block 2508. As shown, the fuel volume adjustment or correction block 2506 "receives" information from the internal combustion engine 2505. In particular, the control arrangement D obtains a signal corresponding to a sensed parameter (such as a rotational speed (rpm) of the engine 2505), and the fuel injection correction block 2506 then determines a fuel injection adjustment or correction volume $\Delta m_{Ei}$ based on the sensed parameter. In particular, the fuel injection correction block 2506 may include a frequency analyzer to evaluate the frequency of the rotational speed. The fuel volume correction block 2506 may then determine a fuel injection correction volume $\Delta m_{Ei}$ and provide it to the adder block 2508. More particularly, the fuel volume correction block 2506 may use the sensed parameter to determine a fuel injection correction value $\Delta m_{Ei}$ for each cylinder of the internal combustion engine (where "i" corresponds to a particular cylinder). In the control arrangement D, the adder block 2508 adds the fuel injection correction value $\Delta m_{Ei}$ to the fuel injection volume $m_E$. The fuel injection correction value $\Delta m_{Ei}$ corresponds to a fuel quantity deviation in a particular cylinder "i" with respect to a mean fuel volume of the other cylinders.

Next, the adder block 2508 outputs the sum $m_E^*$ ($m_E$ and $\Delta m_{Ei}$) to the fuel injection metering block 2509. The fuel injection metering block 2509 determines time periods for the pre-injection, main injection and post-injection operations based on the corrected volume value $m_E^*$ for a particular cylinder. Finally, the activation arrangement E uses the determined time periods to control the piezoelectric elements 10, 20, 30, 40, 50, 60, as discussed herein.

A fuel injection volume determination system, which implements the fuel volume injection determination block 2507, the fuel injection volume correction block 2506 and the fuel injection metering block 2509, is available from Robert Bosch GMBH, Stuttgart, Federal Republic of Germany.

In the control arrangement D, the optimization block 2510 may determine a further adjustment or incremental voltage $K_o$ based on the fuel correction value $\Delta m_{Ei}$ for each cylinder that is received from the fuel injection volume correction block 2506, since a cylinder may be influenced by the various operating characteristics of the particular piezoelectric actuator or element corresponding to the cylinder. The optimization block 2510 may provide the incremental voltage $K_o$ to the adder block 2503, which then adds the incremental voltage $K_o$ to the base voltage (which may be adjusted, as discussed above, to reflect the estimated effects of temperature and other operating characteristics on a piezoelectric element) to determine the target activation voltage that may be provided to the voltage and voltage gradient regulation block 2504. Thereafter, the optimization block 2510 again monitors the value of $\Delta m_{Ei}$ based on the newly adjusted target voltage, and the control arrangement D continues this procedure until the optimal activation voltage $U_{opt}$ is reached so that the maximum fuel volume is injected during the appropriate time period, as is shown in FIG. 2.

In particular, this optimization procedure may be repeated for each cylinder to achieve an optimal activation voltage $U_{opt,i}$ for each cylinder, and, as discussed, the optimization block 2510 monitors the fuel injection correction $\Delta m_{Ei}$ after an adjusted target voltage is provided to the activation arrangement E. If the fuel injection correction $\Delta m_{Ei}$ decreases due to the change, then the target voltage adjustment resulted in a greater volume of injected fuel and the adjustment direction was correct. The optimization block 2510 may then determine another incremental voltage $K_o$, which the adder block 2503 adds to the desired or target voltage, and if the fuel injection correction value of $\Delta m_{Ei}$ continues decreasing, then the control arrangement D may continue this procedure until the fuel injection correction value $\Delta m_{Ei}$ falls below a threshold value. If, however, the fuel injection correction value $\Delta m_{Ei}$ increases after a target voltage adjustment, then the adjustment direction was incorrect and the optimization block 2510 may determine another adjustment voltage $K_o$. Thus, for example, the optimization block 2510 may determine a negative incremental voltage $K_o$, that reduces the desired or target voltage when the adder block 2503 adds it to the base or adjusted base voltage.

Thus, the optimization block 2510 optimally adjusts the activation voltage $U_{opt}$ for a particular piezoelectric element 10, 20, 30, 40, 50, 60 and may also compensate for any temperature effects and/or for any differences in the operating characteristics among the piezoelectric elements 10, 20, 30, 40, 50, 60, including changes in the operating characteristics, such as aging effects, for any particular piezoelectric element. Also, for example, an optimal activation voltage may be affected by a switching time of the piezoelectric element driver and to the extent that this may cause, for example, the actual voltage gradient to differ from the desired voltage gradient, system operation may be improved by compensating for this effect.

Finally, the desired or target voltage may be provided to the voltage and voltage gradient regulation block 2504 to determine an appropriate driving current (whether charging or discharging) and appropriate voltage. In particular, the voltage and voltage gradient regulation block 2504 determines the desired or target voltage and a corresponding desired voltage gradient. The voltage and voltage gradient regulation block 2504 then provides the desired or target voltage to the activation arrangement E that applies it to the piezoelectric element. As discussed, the activation arrangement E compares the resulting measured voltages of the piezoelectric elements to the desired or target voltages using the comparator arrangement or system 830. The operation of the voltage and voltage gradient regulation block 2504 is described further with respect to FIG. 7b.

Figure 8:
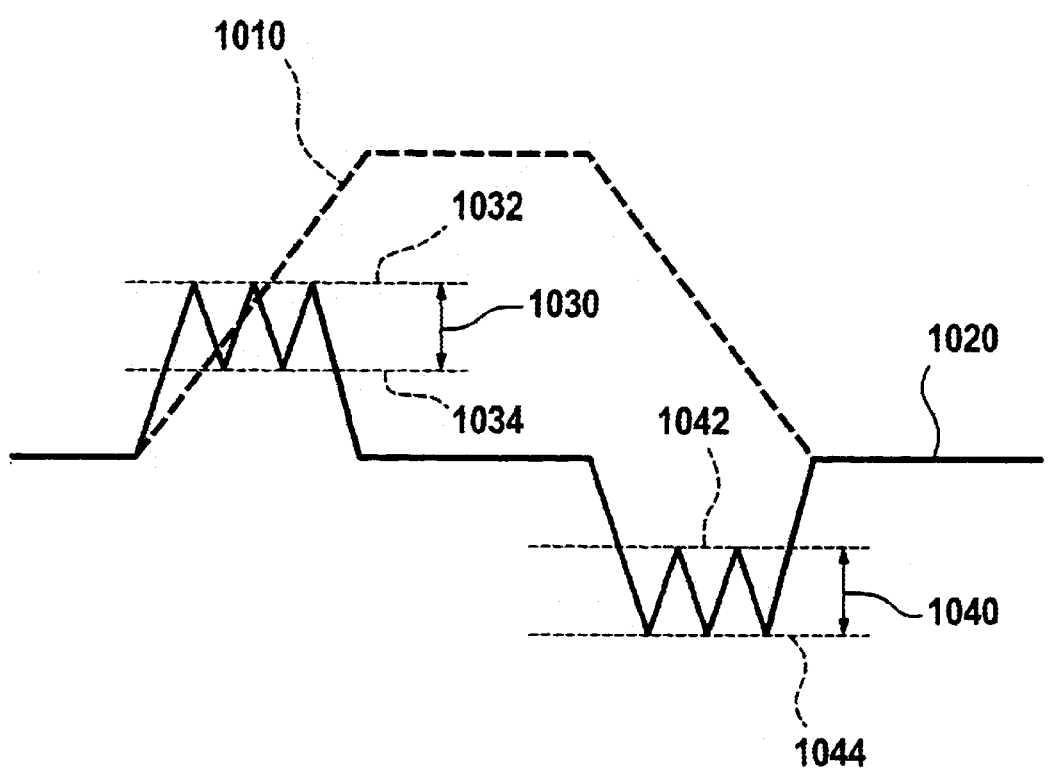
FIG. 8 shows a relationship between currents, voltages and voltage gradients in a charging and discharging cycle.

In FIG. 8 is shown a relationship between the activation voltage (and the voltage gradient) 1010 and the current 1020 in a charging and discharging cycle. During the charging of the piezoelectric element, the current 1020 supplied to the piezoelectric element may be maintained within a charging current band 1030. Thus, when the charging current reaches a maximum charging current limit or threshold 1032, the charging current is "cutoff" until it decreases to a minimum charging current limit or threshold 1034. Thereafter, the piezoelectric element is charged until the current again increases to the maximum charging current limit 1032 of the charging current band 1030. This process may be repeated a number of times during the charging of the piezoelectric element until the piezoelectric element reaches the desired extension length.

The same procedure may be repeated during the discharging process. That is, the discharging current may be maintained within a discharging current band 1040 having minimum and maximum discharging current limits or thresholds 1044 and 1042. The charging current band 1030 and the discharging current band 1040 are intended to prevent damage to the piezoelectric element. Also, during the charging and discharging processes, the current limits may be adjusted based on the measured or determined currents, voltages and/or associated voltage gradients so that appropriate driving currents, voltages and associated voltage gradients may be maintained. Finally, the current limits may be determined for each cylinder.

Figure 7B:
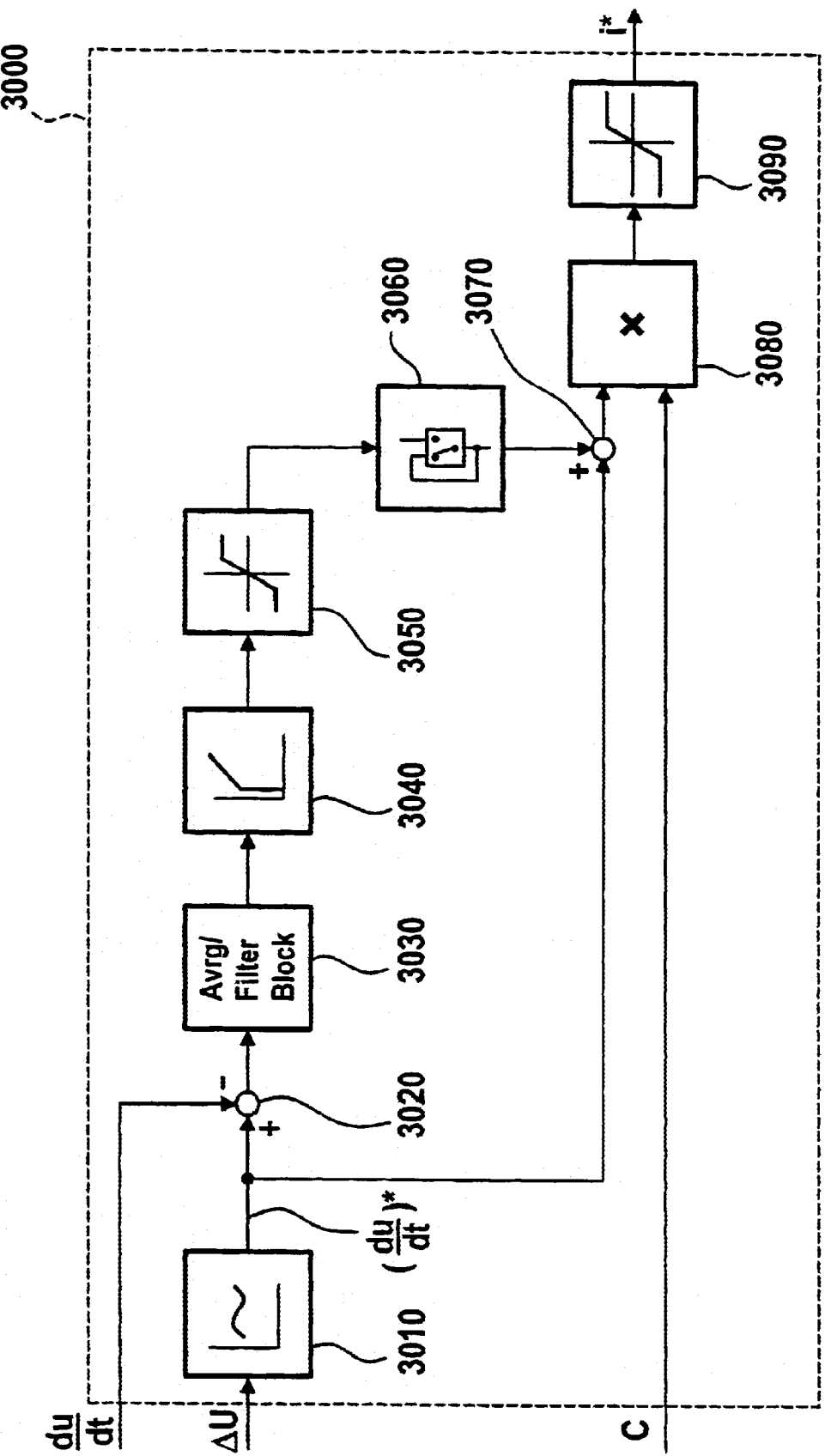

The above process may be implemented by the voltage and voltage gradient regulation block 2504 to drive the piezoelectric actuator or element using the activation arrangement E. In FIG. 7b is shown a task block diagram of a voltage gradient regulation sub-system 3000 that may be implemented in the voltage and voltage gradient regulation block 2504. The voltage gradient regulation sub-system 3000 of FIG. 7b may be implemented separately for the various charging and discharging operations since various cycle parameters may differ with respect to the charging and discharging operations, but the task methodology is the same. In FIG. 7e is shown an exemplary embodiment of a voltage controller arrangement 3500 that may be used in the control arrangement D of FIG. 4 and FIG. 7a, and is discussed below.

Figure 9A:
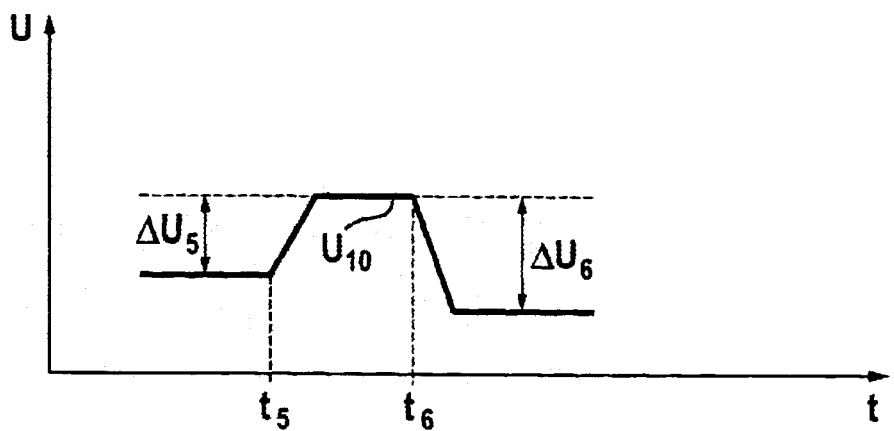
FIG. 9a shows a voltage profile associated with the operation of a two-position fuel injector, which may include a single-acting, single-seat control valve.

In this regard, FIG. 9a shows, for example, the activation voltage and voltage gradients for a single-acting, single-seat control valve, in which a desired voltage difference ΔU5 for a charging operation may be like a desired voltage difference ΔU6 for a discharging operation. In particular, before the voltage difference ΔU5 is applied, the control valve is first closed. After the voltage difference ΔU5 is applied, the control valve is opened. When the voltage difference ΔU6 is applied, the control valve is again closed. Finally, the voltage gradient controller sub-system 3000 of FIG. 7b may be implemented for each of the charging and discharging operations.

Figure 9B:
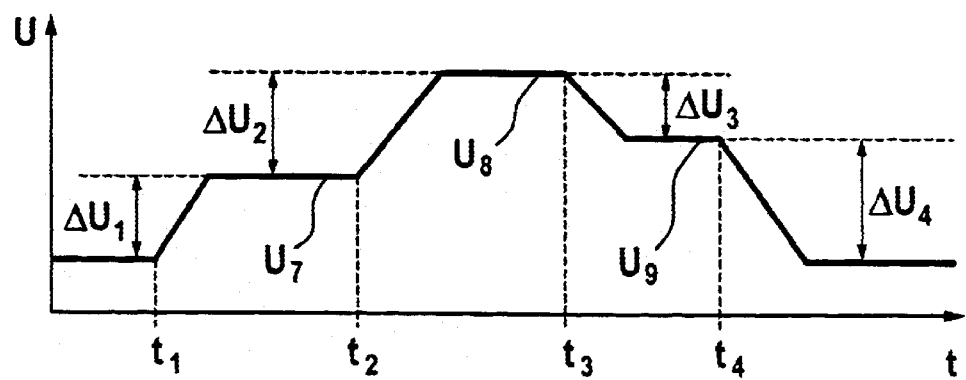
FIG. 9b shows a voltage profile associated with the operation of a three-position fuel injector, which may include a double-acting, double-seat control valve.

Likewise, FIG. 9b shows, for example, the activation voltage and voltage gradients for a double-acting, double-seat control valve, in which a first desired voltage difference ΔU1 for a first charging operation is different from a second desired voltage difference ΔU2 for a second charging operation, and in which a third desired voltage difference ΔU3 for a first discharging operation is different from a fourth desired voltage difference ΔU4 for a second discharging operation. In particular, before the voltage difference ΔU1 is applied, the control valve is closed in its first closed position. After the voltage difference ΔU2 is applied, the control valve is first opened. When the voltage difference ΔU2 is applied, the control valve is closed in its second closed position. After the voltage difference ΔU3 is applied, the control valve is again opened. Finally, when the voltage difference ΔU4 is applied, the control valve is again closed in its first closed position.

Additionally, for a multi-position control valve, such as, for example, a double-acting, double-seat control valve, the voltage gradient controller sub-system 3000 of FIG. 7b may be implemented for each of the two charging operations and for each of the two discharging operations. This is because the operating parameters may differ for the first and second charging operations and the first and second discharging operations.

In FIG. 7b is shown, for example, a proportional-integral ("PI") controller-based voltage gradient controller apparatus or sub-system 3000 for use in the voltage and voltage gradient regulation block 2504, as referred to above, and which may be implemented for each of the charging and discharging processes, as discussed above.

For the charging process, the control arrangement D determines an actual measured voltage gradient du/dt, a desired voltage change and a capacitance of the piezoelectric element. In particular, the control arrangement D may determine the actual measured voltage gradient du/dt based on the measured voltages and the determined charging times that are provided by the activation arrangement E. The control arrangement D may determine the desired voltage change by determining a difference between the desired or target voltage and the measured voltage. The desired voltage changes may correspond, for example, to the voltage changes ΔU1, ΔU2 or ΔU4 of FIG. 9b and FIG. 9a, respectively. The control arrangement D may determine the capacitance of the piezoelectric element in a suitably appropriate way, and may use, for example, the apparatuses, arrangements and methods described below with respect to FIG. 7c.

As shown, the voltage and voltage gradient regulation block 2504 may first determine a desired or setpoint voltage gradient (du/dt)* by using a characteristic curve that defines a relationship between voltage changes and voltage gradients. The characteristic curve may be stored in a memory of the control arrangement D, and may reflect, for example, empirical data of the voltage changes and corresponding voltage gradients.

Next, the voltage and voltage gradient regulation block 2504 may determine a system deviation by having a differencer or subtractor arrangement 3020 determine a difference between the desired voltage gradient (du/dt)* and the determined actual voltage gradient du/dt. Also, the voltage and voltage gradient regulation block 2504 may include an averaging and/or filter block 3030. In particular, the block 3030 may be used to average the system deviations for all piezoelectric elements or actuators to minimize or at least reduce device-specific errors. The block 3030 may also include, for example, a suitably appropriate digital filter to digitally filter the system deviation so that "insufficient" changes may be ignored. The resulting system deviation (which may be averaged and/or digitally filtered) is then provided to a suitably appropriate deviation controller block 3040. In the exemplary embodiment, the controller block 3040 is a PI controller block, but may also be, for example, a proportional-integral-differential ("PID") controller or any other suitably appropriate controller. The voltage gradient controller apparatus or sub-system 3000 may also include a change limiter block 3050.

The voltage gradient controller apparatus or sub-system 3000 may also include a hold block 3060, which may be arranged to receive the output of the PI controller block 3040 (which may be limited by the change limiter block 3050). The hold block 3060 may be used to hold or "freeze" an output of the PI controller block 3040, which may be limited by the limiter block 3050, when necessary during charging or discharging the piezoelectric elements. It is believed that the holding feature may be useful when, for example, "top" voltage levels may not be measurable for a double-acting, double-seat control valve that is driven as a single-acting valve, or when, for example, the charging current may not be regulatable.

Next, the voltage gradient controller apparatus or sub-system 3000 adds or combines the output of the PI controller block 3040, which may be limited by the change limit block 3050, or the "hold" controller value to the cylinder-specific desired or setpoint voltage gradient (du/dt)* (which may be provided by the desired voltage gradient characteristic curve block 3010) in the adder block 3070. The resulting adjusted voltage gradient may then be provided to a multiolier block 3080, which multiplies the adjusted voltage gradient by a capacitance of the piezoelectric element to determine a corresponding charging driving current for the piezoelectric element. As discussed, the capacitance may be determined by a suitably appropriate apparatus, arrangement and/or method, including the arrangements and methods discussed with respect to FIG. 7c.

Although not shown, the control arrangement D, including the voltage gradient controller apparatus or sub-system 3000, may also adjust the determined average charging current to compensate for specific device errors that may be associated with the piezoelectric element. This may be done by using the determined average charging current for the piezoelectric actuator to determine a compensated or corrected average charging current from a characteristic curve (or other suitably appropriate information source) reflecting such error information that may be associated with the average discharging current for the piezoelectric actuator or element.

The controller apparatus or sub-system 3000 may also include another change limiter block 3090 so that the determined driving current does not exceed the appropriate charging current limits. The controller apparatus or sub-system 3000 may then output an average charging current that the activation arrangement E applies to the piezoelectric actuator or element.

A similar apparatus, arrangement and/or method may be used for regulating the driving discharging currents, as well as the activation voltages and associated voltage gradients, of a piezoelectric actuator or element.

Thus, for the discharging process, the control arrangement D may again determine an actual measured voltage gradient du/dt, a desired voltage change and a capacitance of the piezoelectric element. In particular, the control arrangement D may determine the actual measured voltage gradient du/dt based on the measured voltages and the determined charging times that are provided by the activation arrangement E. The control arrangement D may determine the desired voltage change by determining a difference between the desired or target voltage and the measured voltage. The desired voltage changes may correspond, for example, to the voltage changes ΔU3, ΔU4 or ΔU6 of FIG. 9b and FIG. 9a, respectively. The control arrangement D may determine the capacitance of the piezoelectric element in a suitably appropriate way, using, for example, the apparatuses, arrangement and methods described below with respect to FIG. 7c.

As shown, the voltage and voltage gradient regulation block 2504 may first determine a desired or setpoint voltage gradient (du/dt)* by using a characteristic curve that defines a relationship between voltage changes and voltage gradients. Next, the voltage and voltage gradient regulation block 2504 may determine a system deviation by having the differencer or subtractor arrangement 3020 determine a difference between the desired voltage gradient (du/dt)* and the determined actual voltage gradient du/dt. Also, the voltage and voltage gradient regulation block 2504 may include the averaging and/or filter block 3030. The resulting system deviation (which may be averaged and/or digitally filtered) is then provided to the suitably appropriate controller block 3040. In the exemplary embodiment, the controller block 3040 may be a PI controller block, but may also be, for example, a proportional-integral-differential ("PID") controller or any other suitably appropriate controller.

The controller apparatus or sub-system 3000 may also include a change limiter block 3050 to limit the output of the PI controller block 3040. The controller apparatus or sub-system 3000 may also include the hold block 3060, which may be arranged to receive the output of the PI controller block 3040 (which may be limited by the change limiter block 3050). The hold block 3060 may be used to hold or "freeze" an output or the PI controller block 3040, which may be limited by the limiter block 3050, when necessary during charging or discharging the piezoelectric elements.

Next, the controller apparatus or sub-system 3000 adds or combines the output of the PI controller block 3040, which may be limited by the change limit block 3050, or the "hold" controller value to the cylinder-specific desired or setpoint voltage gradient (du/dt)* (which may be provided by the desired voltage gradient characteristic curve block 3010) in the adder block 3070. The resulting adjusted voltage gradient may then be provided to a multiplier block 3080, which multiplies the adjusted voltage gradient by a capacitance of the piezoelectric element to determine a corresponding discharging driving current for the piezoelectric element. As discussed, the capacitance may be determined by a suitably appropriate apparatus, arrangement and/or method, including the apparatuses, arrangements and methods discussed with respect to FIG. 7c.

Although not shown, the control arrangement D, including the controller apparatus or sub-system 3000, may also adjust the determined average charging current to compensate for specific device errors that may be associated with the piezoelectric element. This may be done by using the determined average charging current for the piezoelectric actuator to determine a compensated or corrected average charging current from a characteristic curve (or other suitably appropriate information source) reflecting such error information that may be associated with the average discharging current for the piezoelectric actuator or element.

The controller apparatus or sub-system 3000 may also include another change limiter block 3090 so that the determined discharging driving current does not exceed the appropriate discharging current limits. The controller apparatus or sub-system 3000 then outputs an average discharging current that the activation arrangement E applies to the piezoelectric actuator or element.

The voltage controller 3500 of FIG. 7e is now discussed with respect to FIG. 9a and FIG. 9b as follows:

In this regard, FIG. 9a further shows, for example, an operating voltage U10 for a single-acting, single-seat control valve. In such a case, one voltage controller sub-system 3500 may be implemented in the voltage and voltage gradient regulation block 2504 for the voltage level operating point U10. Also shown, for example, are times t5 and t6, which may correspond to those times when the voltages are measured so that they may be considered in the operation of the voltage and voltage gradient block 2504. In short, for example, when the voltage is at U10 at an appropriate time t6, the voltages may be controlled by comparing the measured voltages with the desired or target voltages by using, for example, the voltage controller sub-system 3500 of FIG. 7e to control the deviations between the actual and desired voltages at these times.

Likewise, FIG. 9b further shows, for example, activation voltages U7 U8 and U9 for a double-acting, double-seat control valve. In such a case, three voltage controller sub-systems 3500 may be implemented in the voltage and voltage gradient regulation block 2504 for each of the voltage level operating points U7, U8 and U9. Also shown, for example, are times t1, t2, t3 and t4, which may correspond to those times when the voltages are measured so that they may be considered in the operation of the voltage and voltage gradient block 2504. In short, for example, when the voltages are at U7, U8 or U9 at the appropriate times t2, t3 or t4, the voltages at these levels may be controlled by comparing the measured voltages with the desired or target voltages by using, for example, the voltage controller subsystem 3500 for each of the three voltage levels to control the deviations between the actual and desired voltages at these times.

In FIG. 7e is shown, for example, a proportional-integral ("PI") controller-based voltage controller apparatus or subsystem 3500 for use in the voltage and voltage gradient regulation block 2504, as referred to above, and which may be implemented for the voltage regulation processes discussed above.

As shown, the voltage and voltage gradient regulation block 2504 may first obtain the desired or setpoint voltage from the block 2503, as discussed above.

Next, the voltage regulation block sub-system 3500 may determine a system deviation by having a differencer or subtracter arrangement 3520 determine a difference between the desired voltage and a determined or measured actual voltage. Also, the voltage regulation sub-system 3500 may include an averaging and/or filter block 3530. In particular, the block 3530 may be used to average the system voltage deviations for all piezoelectric elements or actuators to minimize or at least reduce device-specific errors. The block 3530 may also include, for example, a suitably appropriate digital filter to digitally filter the system deviations so that "insufficient" voltage changes may be ignored. The resulting system deviation (which may be averaged and/or digitally filtered) may then be provided to a suitably appropriate deviation controller block 3540. In the exemplary embodiment, the deviation controller block 3540 may be a PI controller block, but may also be, for example, a proportional-integral-differential ("PID") controller or any other suitably appropriate controller. The voltage controller apparatus or sub-system 3500 may also include a voltage change limiter block 3550 to limit voltage output changes.

The voltage controller apparatus or sub-system 3500 may also include a hold block 3560, which may be arranged to receive the output of the deviation controller block 3540 (which may be limited by the voltage change limiter block 3550). The hold block 3560 may be used to hold or "freeze" a voltage output of the deviation controller block 3540 (which may be limited by the voltage change limiter block 3550) when necessary during operations. As discussed, it is believed that the holding feature may be useful.

Next, the voltage controller apparatus or sub-system 3500 adds or combines the output of the Deviation controller block 3540, which may be limited by the change limiter block 3550, or the "hold" controller value to the cylinder-specific desired or setpoint voltage in the adder block 3570. The voltage controller apparatus or sub-system 3500 may also include another voltage change limiter block 3590 so that the new target voltage does not exceed the appropriate voltage limits. The voltage controller apparatus or sub-system 3500 may then output the new target voltage, which the activation arrangement E may then apply to the piezoelectric actuator or element.

Figure 7C:
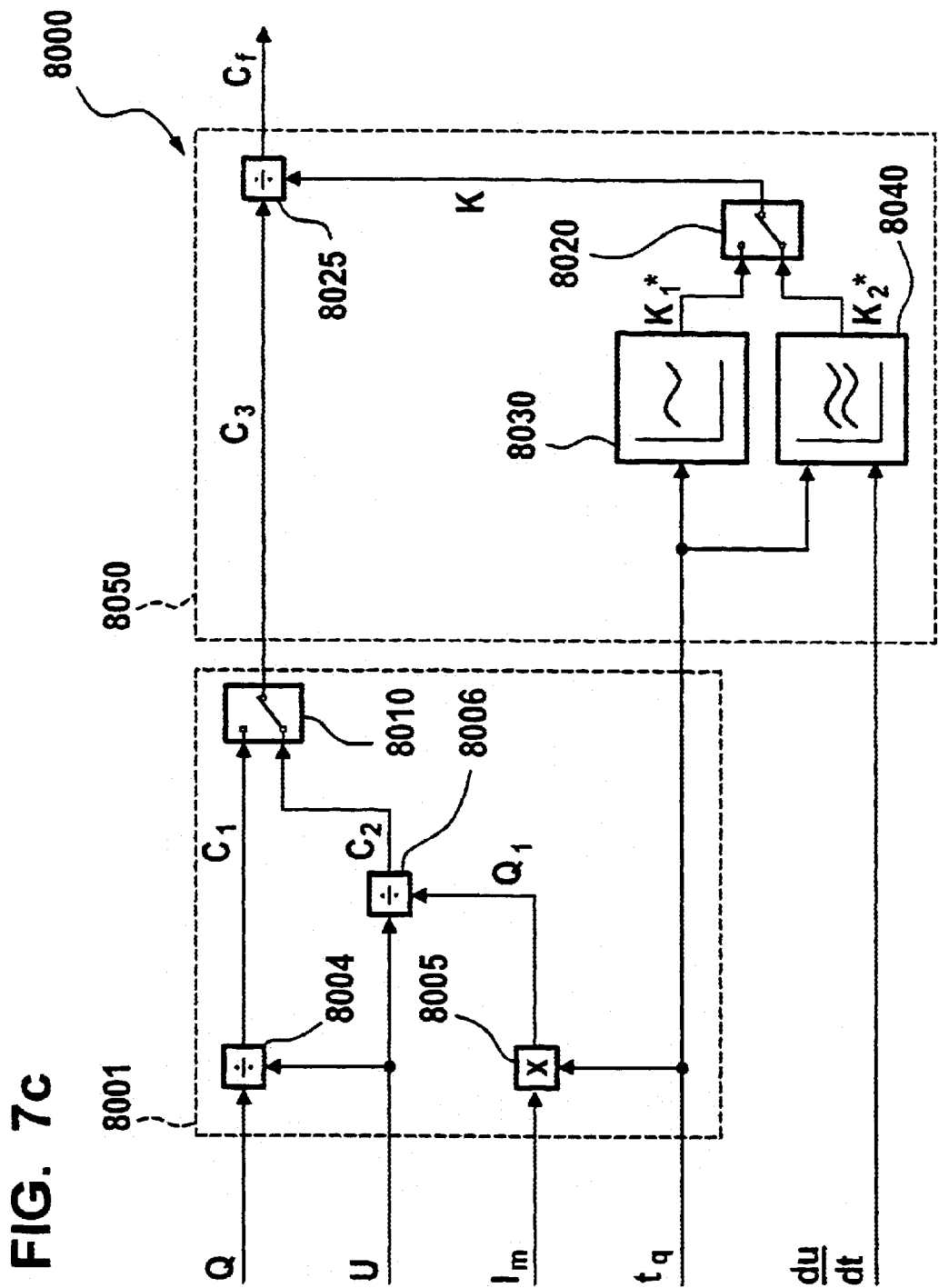

In FIG. 7c is shown a task block diagram of a capacitance determining apparatus, arrangement and/or method 8000 that the control arrangement D may include to determining a capacitance of a piezoelectric element. The capacitance determining sub-system 8000 may include a base capacitance determining block 8001 that may provide a base capacitance, and may also include a normalized capacitance block 8050 that may provide a normalized or frequency-adjusted capacitance $C_f$.

As shown, the control arrangement D may determine the capacitance in the capacitance determining block 8001 based on various ones of the following input parameters: a determined charge quantity Q associated with a piezoelectric element; an actual voltage U associated with a piezoelectric element; a determined average driving current $I_m$ (such as the charging current) and/or an associated driving time $t_q$ (such as the charging time). The determined charge quantity Q, the actual voltage U and/or the associated driving time $t_q$ may be provided, for example, by the activation arrangement E, as discussed herein. In particular, the control arrangement D may use a suitably appropriate arrangement (such as, for example, a time counter) and/or method to determine the driving time. The control arrangement D, through the voltage and voltage gradient regulation block 2504, may be used to provide the average driving current.

In one approach, the base capacitance determining block 8001 may use a divider block 8009 to divide or ratio the input parameters Q and U to provide a capacitance C1, which is one measure of the capacitance associated with a piezoelectric element. In another approach, another divider block 8006 may be used to divide or ratio a determined charge quantity Q1 and the input parameter U to provide a capacitance C2, which is another measure of the capacitance associated with the piezoelectric element. As shown, the base capacitance determining block 8001 may determine the determined charge quantity Q1 by using a multiplier block 8005 to multiply the average driving current $I_m$, (which may be obtained from the voltage and voltage regulation block 2504) and the driving time $t_q$. Additionally, a selecting or switching block 8010 may be used to select one of the base capacitances C1 or C2 to provide a selected base capacitance C3. Although shown as a switch, the selecting block 8010 may also average or otherwise combine the alternative capacitances C1 and C2 to determine the selected base capacitance C3. Thus, any one or more of the foregoing approaches (or any other suitably appropriate method) may be used to determine a base capacitance for a piezoelectric element.

The normalizing capacitance block 8050 may also be implemented to determine the normalized or frequency adjusted capacitance that may better reflect any frequency dependency of the actual capacitance of the piezoelectric element. In one approach, the normalizing capacitance block 8050 may obtain an adjustment or correction factor K1* by using, for example, a characteristic curve 8030 of the inverse relationship between the "frequency" time $t_q$ and the capacitance. In another approach, the normalizing capacitance block 8050 may obtain another adjustment factor K2* by using, for example, another characteristic curve 8040 of the relationship among the voltage gradient du/dt, the "frequency" time $t_q$ and capacitance. Additionally, a selecting or switching block 8020 may be used to select one of the adjustment factors K1* or K2* to provide a selected adjustment factor K3*. Although shown as a switch, the selecting block 8020 may also average or otherwise combine the alternative adjustment factors K1* and K2* to determine the selected adjustment factor K3*. Thus, any one or more of the foregoing approaches (or any other suitably appropriate method) may be used to determine a frequency adjustment or compensation factor that may be applied to a base capacitance of a piezoelectric element. In the exemplary embodiment, a divider block 8025 may then be used to adjust the base capacitance C3 based on the selected adjustment factor K3* to provide the normalized or frequency compensated capacitance $C_f$ of the piezoelectric element.

Figure 7D:
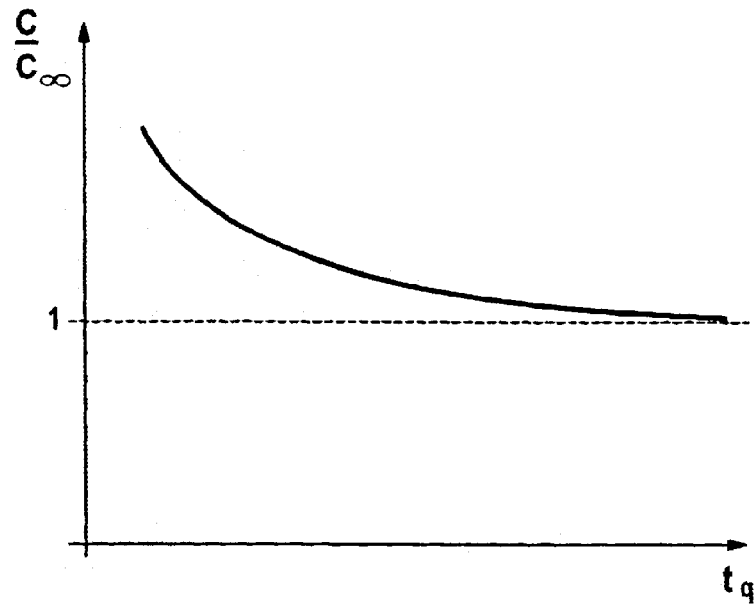
FIG. 7d shows a relationship between a charging time of a piezoelectric element and a ratio of a capacitance for various charging times of the piezoelectric element to its capacitance for sufficiently large or "infinite" charging times.
Figure 7E:
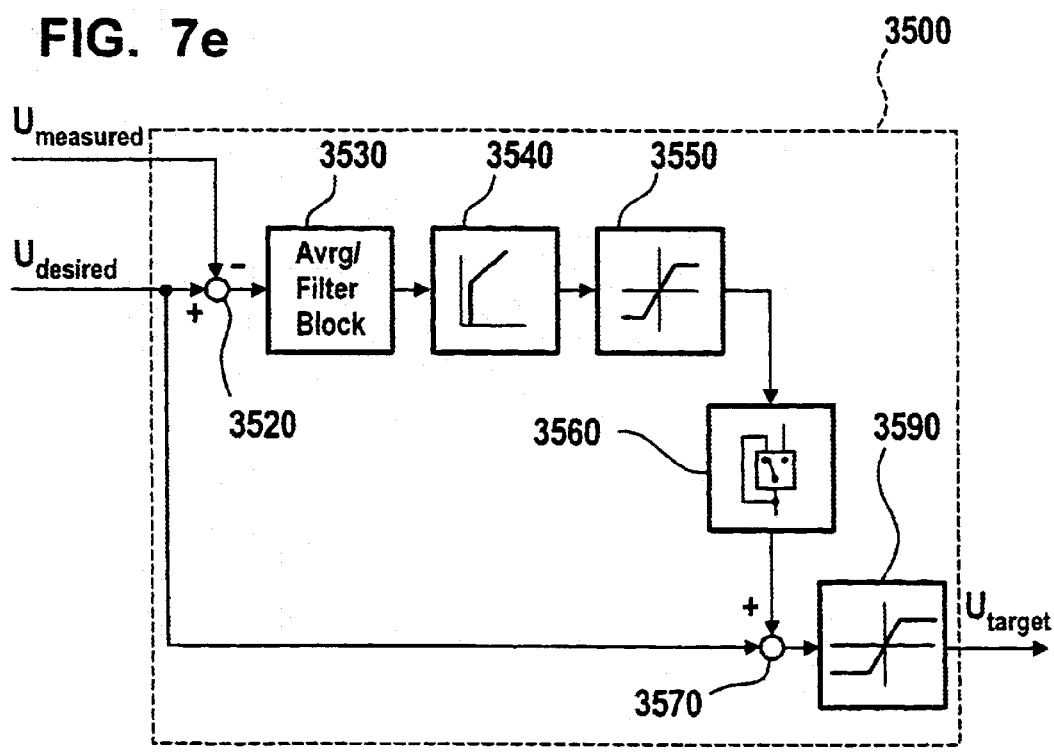

In FIG. 7d is shown a relationship between a charging time of a piezoelectric element and a ratio of a capacitance for various charging times of the piezoelectric element to its capacitance for sufficiently large or "infinite" charging times. Referring to FIG. 7d, it may be seen that as the charging time $t_q$ for the piezoelectric element increases, the capacitance C of the piezoelectric element decreases and approaches the capacitance $C_\infty$ of the piezoelectric element.

As discussed, the capacitance of the piezoelectric element may be used, for example, to determine a temperature and/or a temperature compensation factor $K_T$ associated with the piezoelectric element.

Although not shown, the control arrangement D may include a microcontroller. In particular, the control arrangement D may include, for example, a main processing arrangement or central processing unit, an input-output processing arrangement or timing processing unit and an analog-to-digital converter arrangement. Although the main processing arrangement and the input-output processing arrangement may be separate, the control arrangement D may also include a single processing arrangement for performing the tasks and operations of the main processing arrangement and the input-output processing arrangement. The analog-to-digital converter arrangement may be associated with a buffer memory arrangement for storing the measured parameters, which the activation arrangement E may provide via the sensing lines 700 and 710 (which are associated with voltage measuring points 600 and 610, respectively) or which may be provided via the sensing lines 700 and 710. The buffer memory arrangement may also be used to store a determined or measured charge quantity Q, which the activation arrangement E may provide to the control arrangement D via the charge quantity line 890.

Figures 10A, 10B, 10C, 10D:
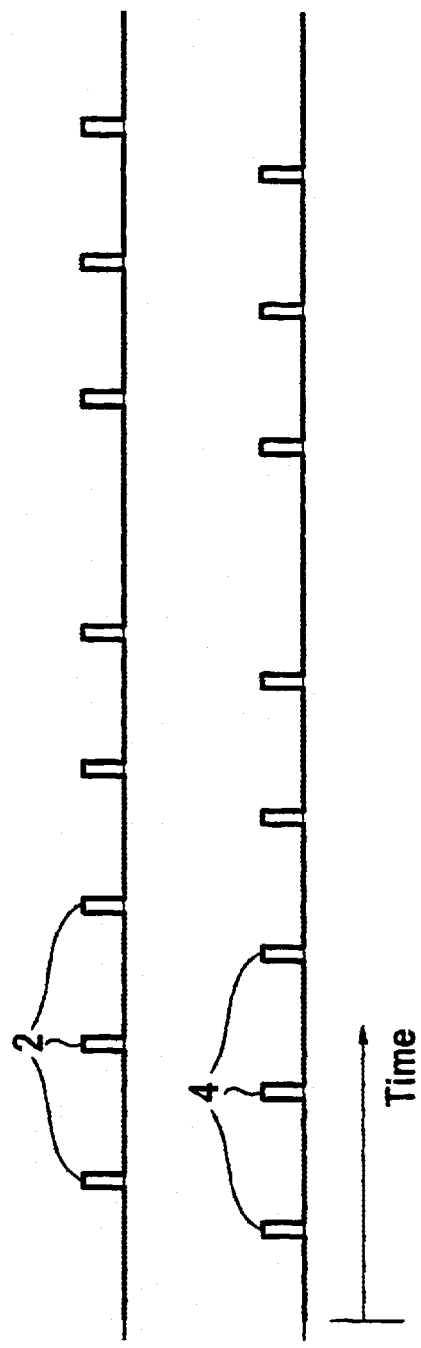

The control arrangement D may use "strobing" pulses or timing signals. In this regard, FIG. 10a shows an exemplary Fuel injection cycle profile over time for an double-acting, double-seat control valve, in which a positive displacement on the vertical axis corresponds respectively to one of the following: a first pre-injection event VE1; a second pre-injection event VE2; a main injection event HE; and a post-injection event NE. In FIG. 10b is shown a control valve position profile of the control valve over time for the control valve having the injection profile of FIG. 10a. As shown, the control valve has a lower seat (or first) closed position LC, a middle open position MO and an upper seat (or second) closed position UC so that fuel injection occurs for the MO position and no fuel injection occurs for the LC and UC positions. In FIG. 10c is shown strobe pulses or signals 2 that correspond to the injection profile of FIG. 10a, and which are used as control or timing signals to control or time the start of the charging or discharging cycles. In particular, the strobe pulses 2 correspond to the beginning and ending of the fuel injection events VE1, VE2, HE and NE.

In FIG. 10d is shown another set of timing pulses 4 that are associated with the charge quantity Q and the voltage. The control arrangement D may use the measurement timing pulses 4 to cause the system to measure charges and voltages in synchronization with the fuel injection operations. The quantity measurement timing pulses 4 may preferably occur a constant time offset Δt before or after charging or discharging the piezoelectric actuator or element. That is, the time offset Δt may occur before the beginning or after the trailing edge of a strobe pulse 2. As shown, the charge quantity measurement timing pulses 4 are set to occur at a time offset Δt after the trailing edge of a corresponding strobe pulse 2. In other embodiments, the time offset Δt may be of variable magnitude and/or may occur before the beginning of certain strobe pulses and after the end of other strobe pulses. The measurement timing pulses 4, which may be generated by the control arrangement D, are further discussed below.

The control arrangement D may also determine the piezoelectric actuator or element that is to be charged or discharged (that is, which cylinder injection valve is to be affected), and therefore the piezoelectric actuator or element voltage that is to be measured. The control arrangement D outputs the strobe pulse or signal 2 (as well as an identification of the specific piezoelectric actuator or element, or alternatively, the bank G1 or G2 of the specific piezoelectric actuator or element) to an input-output processing arrangement. The control arrangement D may preferably increment the piezoelectric actuator or element to be measured every two crankshaft revolutions and in synchronization with a four-stroke engine working cycle, but may also use any other suitably appropriate approach or method.

The charge quantity or voltage may be obtained by first converting the instantaneous analog charge quantity or voltages (received via sensor line 890 or from the activation arrangement E via lines 700 and 710) corresponding to the charge quantity or voltage across a particular piezoelectric element group G1 and G2, respectively, into digital values. The resulting digital values may then be stored. Because the analog-to-digital converter arrangement may have no information concerning whether G1 or G2 is the active injection group, the voltages for both G1 and G2 may be obtained simultaneously and the results then stored. The control arrangement D may then obtain the stored values after the injection event is completed.

Alternatively, the charge quantity or voltage of only one injection event of a particular injection cycle for a particular piezoelectric actuator or element may be measured. Thus, for example, only a charge quantity or voltage for an HE event of a cycle, which may include, for example, the VE1, VE2, HE and NE events of FIG. 10a, may be measured. Such a method may be used to reduce the load on the control arrangement D. Also, a subset of two or more infection events for a particular injection cycle may be measured.

The control arrangement D then analyzes the obtained values, and may then use the information to adjust the voltages and the voltage gradients to reflect any aging, temperature or other characteristics of the piezoelectric element.

Figure 11:
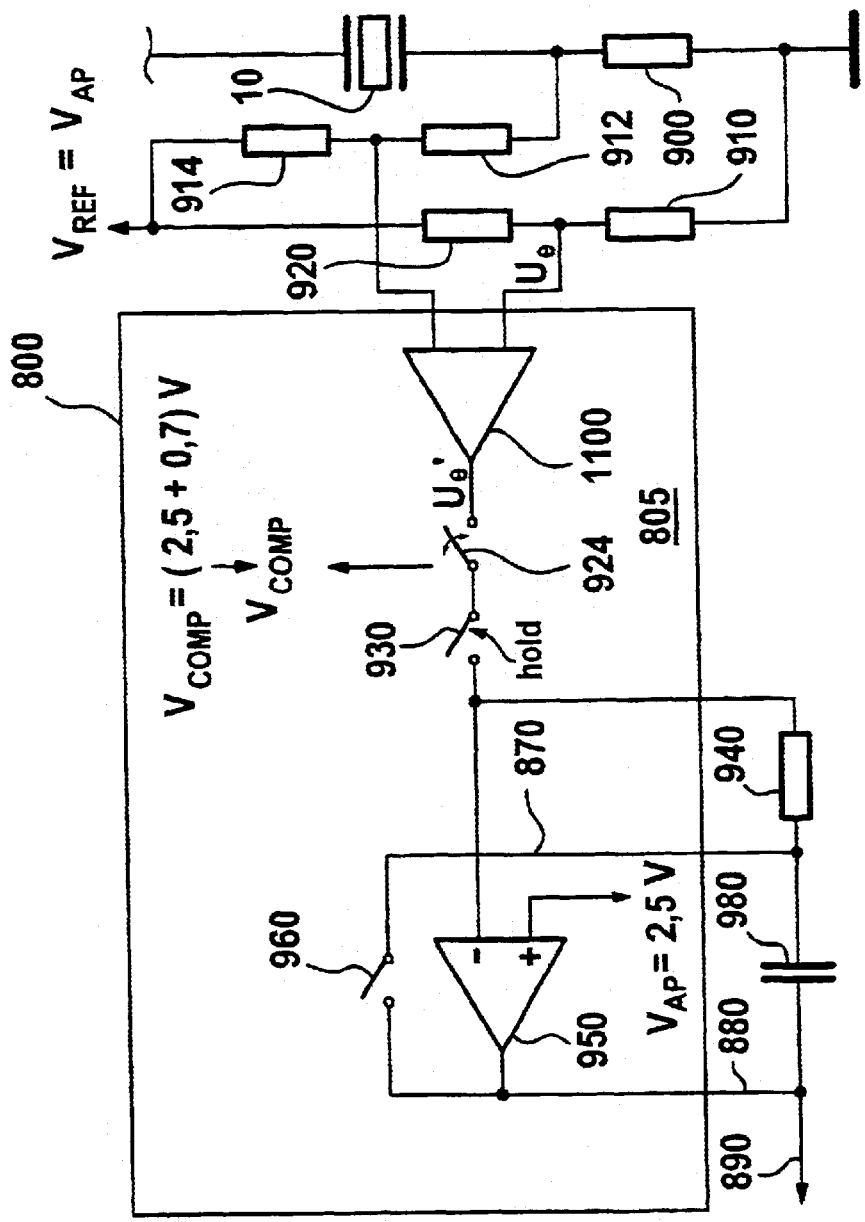
FIG. 11 shows a block diagram of an exemplary embodiment of an arrangement for determining a charge quantity of a piezoelectric actuator or element.

In FIG. 11 is shown a charge quantity determining or measuring arrangement 800 that may be used to determine or measure the charge quantity Q, and which may be used, for example, in the activation arrangement E of the fuel injection control system 100 of FIG. 4.

The charge quantity determining arrangement 800 may include a compensating feature that compensates for the Integration process to improve the determination of the charge quantity. In particular, a charge quantity Q of a piezoelectric element 10 may be measured as follows. As shown, the arrangement 800 includes a shunt resistor 900, a first voltage divider that may include resistors 910 and 920, and a second voltage divider that may include resistors 912 and 914. The first and second voltage divider arrangements (which form a bridge circuit arrangement) provide first divider voltage and a second divider voltage (Ue), respectively, and are intended to ensure that these divider voltages (which are input to a differential amplifier arrangement 1100) are positive. In particular, the divider voltages are raised with respect to a reference voltage Vref. The first and second switch arrangements 924 and 930 (which may be implemented as transistors or any suitably appropriate switching arrangement) are actuated at the beginning of the charging or discharging processes.

An integrating arrangement 805 is formed by a resistor 940, a capacitor 980 and an operational amplifier 950. In particular, the integrating arrangement 805 may, of course, be any suitably appropriate integrating arrangement. As shown, the differential amplifier arrangement 1100 outputs an amplified voltage to the inverting terminal of the operational amplifier 950. A voltage source or operating point $V_{AP}$ (which may be 2.5 volts, for example) may be input to the non-inverting input of the operational amplifier 950. In particular, for example, the first switch 930 (or hold switch 930) may be opened at the end of the charging or discharging process. The signal output on line 890 corresponds to the charge quantity Q that is supplied to the piezoelectric element during charging or that is released from the piezoelectric element during discharging. The charge quantity Q may be provided from the activation arrangement E to the analog-to-digital converter arrangement of the control arrangement D via the line 890, as described above. A third switch (or reset switch) 960 (which may also be a transistor or any suitably appropriate switching arrangement) may be used to discharge the capacitor 980 between measurements to reset the initial value of the integrating arrangement 805 to zero. That is, since the charge quantity determination or measurement includes the charge increments each time, the integrating arrangement 805 is reset before whenever the charging or discharging operation begins for a piezoelectric element.

In particular, one terminal of the reset switch 960 may be coupled to an output of the operational amplifier arrangement 950 and another terminal may be coupled by a first line 870 to a coupling point between the resistor 940 and the capacitor 980. Additionally, one terminal of the capacitor 980 may be coupled to the first line 870 and the other terminal may be commonly coupled to the charge quantity output line 890 and to a second line 880 that may be coupled to the output terminal of the operational amplifier arrangement 950.

In short, the current signal obtained from the shunt resistor 900 is, of course, proportional to the piezoelectric current. The integrating arrangement 805 then integrates the analog current signal, and this done using the operational amplifier arrangement 950, the capacitor 980 (which may be located externally with respect to the activation arrangement E) and the resistor 940. The reset switch 960 ensures that the capacitor 980 is completely discharged before every new measurement. Thus, the integrated current signal corresponds to the charge quantity Q supplied to or removed from the piezoelectric device, and may be output on the line 890 to the analog-to-digital converter of the control arrangement D.

As discussed, the control arrangement D may use the charge quantity to determine a capacitance of the piezoelectric device. In particular, this may be done as follows. The voltage of the piezoelectric element may be measured at about the same time (such as, for example, within 5 microseconds of the charge measurement) using the analog-to-digital converter. As discussed, the control arrangement D may then ratio the charge quantity to the voltage of the piezoelectric element to determine a corresponding capacitance. The preciseness of the charge quantity measurement is believed to be important because, as discussed, the capacitance changes with temperature, as well as other factors, and the maximum travel of the piezoelectric actuator or element, which may be used to obtain the maximum travel associated driving voltages, also changes with temperature of the piezoelectric element.

Thus, the control arrangement D of FIG. 4 may be used to determine an appropriate capacitance of a piezoelectric element based on a ratio of the determined or measured charge quantity Q and the voltage U of a piezoelectric element. Also, as discussed, this capacitance information may be used to adjust the voltages, for example, based on or corresponding to the aging, temperature and other characteristics of a particular piezoelectric element. Thus, the charge quantity information should be accurate to better ensure an accurate or more precise capacitance, which should provide a more accurate driving current and/or voltage.

In this regard, the charge quantity determining arrangement 800 of FIG. 11 may be used to implement a compensating method that may be used to adjust or compensate the integration process and improve a measurement of the charge quantity. In particular, the compensating arrangement and/or method is intended to compensate for or at least reduce the effect of errors that may result from relatively large variations in the capacitor 980, for example. The compensating arrangement and method use the differential amplifier arrangement 1100.

In particular, the compensation methodology involves compensating an integrator arrangement that may be used to integrate a current or voltage of the piezoelectric element at certain times. The compensation may be applied to every measured value that is obtained while determining the capacitance. This should provide more accurate and/or precise measurements of the charge quantity Q. The compensation process may preferably be done when the engine 2505 is started. Alternatively, the compensation process may be repeated at later times to compensate for any charge quantity measurements that may be affected by the operating temperatures associated with the piezoelectric elements.

More particularly, first, second and/or third calibration commands may be used to increase the accuracy of the charge quantity Q. With respect to the first or reset calibration command, which may be referred to as CALIBRATE 1, the hold switch 930 is opened and the reset switch 960 is closed to reset the integrating arrangement 805 so that the operating point $V_{AP}$ may be measured and calibrated. Since the hold switch 930 is open, the status of the switch 924 does not matter. Also, the reference voltage or operating point $V_{AP}$ may be shifted by a suitably appropriate voltage offset with respect to the reference voltage Vref. Thus, following calibration, the calibrated operating point value $V_{AP}$ appears at the output line 890. When the integration arrangement has been reset, it is available for the next integration.

With respect to the second calibration command, which may be referred to as CALIBRATE 2, the hold switch 930 is closed and the switch 924 is also closed when the shunt current via the piezoelectric element is sufficiently small or zero so that the bridge circuit arrangement, which is formed by the two voltage divider arrangements (which include the resistors 910, 912, 914 and 920), may be calibrated.

With respect to the third calibration command, which may be referred to as CALIBRATE 3, a calibration voltage $V_{COMP}$ (such as, for example, the voltage of ($V_{AP}$+0.7) volts) may be compensated over a particular time. In this state, the switch 924 is open so that the integrating arrangement 805 is coupled to the calibration voltage $V_{COMP}$, the hold switch 930 is closed. In this way, the time constant of the integrating arrangement 805 (which is the product of the resistor 940 and the capacitor 980) may be calibrated. In particular, a voltage $U_a$ of the capacitor 890, an RC time constant $T_c$ of the external circuit, an offset voltage $U_{off}$ (which corresponds to an offset voltage associated with the activation arrangement E) and an integration time $T_{int}$ may be arranged to provide the following:

$$U_a = V_{AP} + T_{int} * U_{off}/T_c - 1/T_c \int U_c dt.$$

The reference voltage $U_{ref}$ or $V_{AP}$ may be determined using the first calibration command. The second and third calibration commands may be used to provide two measurement results, namely $U_{a2}$ and $U_{a3}$, which may be used to determine the RC time constant $T_c$ of the integrating arrangement 805, $U_{off2}$ and $U_{off3}$, where the difference between $U_{a2}$ and $U_{a3}$ is equal to the following:

$$T_{calibrate}/T_c * (U_{off2} - U_{off3} + V_{COMP}).$$

Since the difference between the two offset voltages should be sufficiently less than the calibration voltage $V_{COMP}$, the time constant may be determined as follows:

$$1/T_c = (U_{a2} - U_{a3})/U_{calibrate} * T_{calibrate}).$$

Also, $U_{off2}$ may be determined as follows:

$$U_{off2} = (U_{a2} - V_{COMP}) T_c / T_{calibrate}.$$

Accordingly, any deviations in the measurement result may be compensated using these values.

What is claimed is:

1. Fuel injection system with a piezoelectric element (10, 20, 30, 40, 50 or 60) for controlling the amount of injected fuel by charging and/or discharging the piezoelectric element (10, 20, 30, 40, 50 or 60), characterized in that the fuel injection system comprises a current flow controller (3000) for charging and/or discharging the piezoelectric element (10, 20, 30, 40, 50 or 60) as a function of a gradient of a voltage across the piezoelectric element (10, 20, 30, 40, 50 or 60) due to an existing charge the piezoelectric element (10, 20, 30, 40, 50 or 60) is carrying.

2. Fuel injection system according to claim 1, characterized in that the current flow controller (3000) has a desired charging current for charging and/or discharging the piezoelectric element (10, 20, 30, 40, 50 or 60) as an output.

3. Fuel injection system according to claim 1, characterized in that the current flow controller (3000) comprises an integrator.

4. Fuel injection system according to claim 3, characterized in that the current flow controller (3000) comprises a PI-controller.

5. Fuel injection system according to claim 1, characterized in that the current flow controller (3000) comprises at least one charge subcontroller for charging the piezoelectric element (10, 20, 30, 40, 50 or 60) based upon the gradient of the voltage across the piezoelectric element (10, 20, 30, 40, 50 or 60) and at least one discharge subcontroller for discharging the piezoelectric element (10, 20, 30, 40, 50 or 60) based upon the gradient of the voltage across the piezoelectric element (10, 20, 30, 40, 50 or 60).

6. Fuel injection system according to claim 5, characterized in that the current flow subcontroller (3000) and/or the discharge subcontroller comprises a hold element capable of keeping its output at constant value.

7. Fuel injection system according to claim 1, further comprising a double acting valve being driven by the piezoelectric element (10, 20, 30, 40, 50 or 60), the double acting valve having a first closed position, a second closed position, and an open position, characterized in that the current flow controller (3000) comprises a first charge subcontroller for charging the piezoelectric element (10, 20, 30, 40, 50 or 60) based upon the gradient of the voltage across the piezoelectric element (10, 20, 30, 40, 50 or 60) for moving the double acting valve from the first closed position to the open position and a second charge subcontroller for charging the piezoelectric element (10, 20, 30, 40, 50 or 60) based upon the gradient of the voltage across the piezoelectric element (10, 20, 30, 40, 50 or 60) for moving the double acting valve from the open position to the second closed position.

8. Fuel injection system according to claim 7, characterized in that the current flow controller (3000) further comprises a first discharge subcontroller for discharging the piezoelectric element (10, 20, 30, 40, 50 or 60) based upon the gradient of the voltage across the piezoelectric element (10, 20, 30, 40, 50 or 60) for moving the double acting valve from the second closed position to the open position and a second discharge subcontroller for discharging the piezoelectric element (10, 20, 30, 40, 50 or 60) based upon the gradient of the voltage across the piezoelectric element (10, 20, 30, 40, 50 or 60) for moving the double acting valve from the open position to the first closed position.

9. Fuel injection system according to claim 1, characterized in that the current flow controller (3000) comprise a hold element capable of keeping the output of the current flow controller (3000) at a constant value.

10. Fuel injection system with a piezoelectric element (10, 20, 30, 40, 50 or 60) for controlling the amount of injected fuel by charging and/or discharging the piezoelectric element (10, 20, 30, 40, 50 or 60) to a voltage, characterized in that the fuel injection system comprises a voltage controller (3500) for controlling the voltage as a function of a desired and a measured value of the voltage across the piezoelectric element; and characterized in that the voltage controller (3500) controls the voltage based upon a desired value of the voltage an a measured value of the voltage associated with a former injection.

11. Fuel injection system according to claim 10, characterized in that the voltage controller (3500) controls the voltage based upon a desired value of the voltage and a measured value of the voltage associated with a previous injection of fuel.

12. Method for operating a fuel injection system with a piezoelectric element (10, 20, 30, 40, 50 or 60) for controlling the amount of injected fuel, wherein the amount of injected fuel is controlled by charging and/or discharging the piezoelectric element (10, 20, 30, 40, 50 or 60), characterized in that the piezoelectric element (10, 20, 30, 40, 50 or 60) is charged and/or discharged as a function of a gradient of a voltage across the piezoelectric element (0, 20, 30, 40, 50 or 60) due to an existing charge the piezoelectric element is carrying.

13. An apparatus to at least one of charge and discharge a piezoelectric element to control an amount of fuel injected in a fuel injection system, comprising:

a current flow controller configured to at least one of charge and discharge the piezoelectric element as a function of a gradient of a voltage across the piezoelectric element due to an existing charge carried by the piezoelectric element.

14. The apparatus of claim 13, wherein the current flow controller is configured to output a desired charging current to at least one of charge and discharge the piezoelectric element as an output.

15. The apparatus of claim 13, wherein the current flow controller includes an integrator.

16. The apparatus of claim 15, wherein the integrator includes a PI-controller.

17. The apparatus of claim 13, wherein the current flow controller includes at least one charge subcontroller configured to charge the piezoelectric element as a function of the gradient of the voltage across the piezoelectric element and at least one discharge subcontroller configured to discharge the piezoelectric element as a function of the gradient of the voltage across the piezoelectric element.

18. The apparatus of claim 17, wherein at least one of the current flow subcontroller and the discharge includes a hold element configured to maintain an output of the current flow subcontroller at a constant valve.

19. The apparatus of claim 17, wherein the discharge subcontroller includes a hold element configured to maintain an output of the discharge subcontroller at a constant value.

20. The apparatus of claim 13, wherein the current flow controller includes a hold element configured to maintain an output of the current flow controller at a constant value.

21. A fuel injection system, comprising:
a piezoelectric element, at least one of charging and discharging the piezoelectric element controlling an amount of fuel injected into the system; and
a current flow controller configured to at least one of charge and discharge the piezoelectric element as a function of a gradient of a voltage across the piezoelectric element due to an existing charge the piezoelectric element is carrying.

22. The fuel injection system of claim 21, further comprising:
a double acting valve driven by the piezoelectric element, the double acting valve including a first closed position, second closed position, and an open position;
wherein the current flow controller includes a first charge subcontroller and a second charge subcontroller, the first charge subcontroller configured to charge the piezoelectric element as a function of the gradient of the voltage across the piezoelectric element, to move the double acting valve from the first closed position to the open position, and the second charge subcontroller configured to charge the piezoelectric element as a function of the gradient of the voltage across the piezoelectric element to move the double acting valve from the open position to the second closed position.

23. The fuel injection system of claim 22, wherein the current flow controller further includes a first discharge subcontroller and a second discharge subcontroller, the first discharge subcontroller configured to discharge the piezoelectric element as a function of the gradient of the voltage across the piezoelectric element to move the double acting valve from the second closed position to the open position, and the second discharge subcontroller configured to discharge the piezoelectric element as a function of the gradient of the voltage across the piezoelectric element to move the double acting valve from the open position to the first closed position.

24. A apparatus controlling a voltage at least one of charged and discharged across a piezoelectric element to control an amount of fuel injected in a fuel injection system, comprising:
a voltage controller configured to control the voltage as a function of a desired value and a measured value of the voltage across the piezoelectric element;
wherein the desired value and the measured value of the voltage are the desired value and the measured value of the voltage from a prior injection.

25. The apparatus of claim 24, wherein the desired value and the measured value of the voltage are the desired value and the measured value of the voltage from a preceding injection of fuel.

26. A method for operating a fuel injection system, comprising the step of:
determining at least one of a charge and a discharge of a piezoelectric element to control an amount of fuel injected in the system as a function of a gradient of a voltage across the piezoelectric element due to an existing charge carried by the piezoelectric element.

* * * * *

UNITED STATES PATENT AND TRADEMARK OFFICE
CERTIFICATE OF CORRECTION

PATENT NO. : 6,619,268 B2
DATED : September 16, 2003
INVENTOR(S) : Rueger et al.

It is certified that error appears in the above-identified patent and that said Letters Patent is hereby corrected as shown below:

Column 1,
Line 7, change "...preambles of Claims 1 and 10..." to -- ...preamble of Claim 1... --
Line 9, change "...preambles of Claims 13 and 14..." to -- ... preamble of Claim 13... --

Column 23,
Line 6, change "multiolier" to multiplier --

Column 28,
Line 44, change "infection" to -- injection --

Column 33,
Line 17, change "valve" to -- value --

Signed and Sealed this

Seventeenth Day of August, 2004

JON W. DUDAS
*Acting Director of the United States Patent and Trademark Office*